United States Patent
Takizawa

[19]

[11] Patent Number: 5,838,613
[45] Date of Patent: Nov. 17, 1998

[54] SEMICONDUCTOR MEMORY DEVICE HAVING SECURITY FUNCTION

[75] Inventor: Makoto Takizawa, Kawasaki, Japan

[73] Assignee: Kabushiki Kaisha Toshiba, Kawasaki, Japan

[21] Appl. No.: 531,855

[22] Filed: Sep. 21, 1995

[30] Foreign Application Priority Data

Sep. 22, 1994 [JP] Japan ................................ 6-228220

[51] Int. Cl.$^6$ ................................................ G11C 11/34
[52] U.S. Cl. ........................... 365/185.04; 365/189.07; 365/195
[58] Field of Search ................ 365/185.04, 189.07, 365/195, 189.01; 395/490, 491

[56] References Cited

U.S. PATENT DOCUMENTS

| | | | |
|---|---|---|---|
| 4,864,542 | 9/1989 | Oshima et al. | 365/189.01 |
| 5,155,829 | 10/1992 | Koo | 395/490 |
| 5,175,840 | 12/1992 | Sawase et al. | 365/185.04 |
| 5,216,633 | 6/1993 | Weon et al. | 365/185.04 |
| 5,377,343 | 12/1994 | Yaezawa | 395/490 |

FOREIGN PATENT DOCUMENTS

| | | |
|---|---|---|
| 1-129328 | 5/1989 | Japan. |
| 4-74240 | 3/1992 | Japan. |
| 6-282495 | 10/1994 | Japan. |

Primary Examiner—David C. Nelms
Assistant Examiner—Hoai Ho
Attorney, Agent, or Firm—Banner & Witcoff, Ltd.

[57] ABSTRACT

A non-volatile semiconductor memory device includes first, second and third comparators, counter and ring oscillator. The first comparator compares an input address with an access inhibition address. The counter counts the number of changes of addresses input after coincidence of the addresses when the first comparator detects the coincidence of the addresses. The second comparator compares the count number of the counter with a preset count number and operates the ring oscillator when the count numbers coincide with each other. The third comparator compares the cycle number of the ring oscillator with a preset cycle number and scrambles the input address to output error data when the cycle numbers coincide with each other.

40 Claims, 31 Drawing Sheets

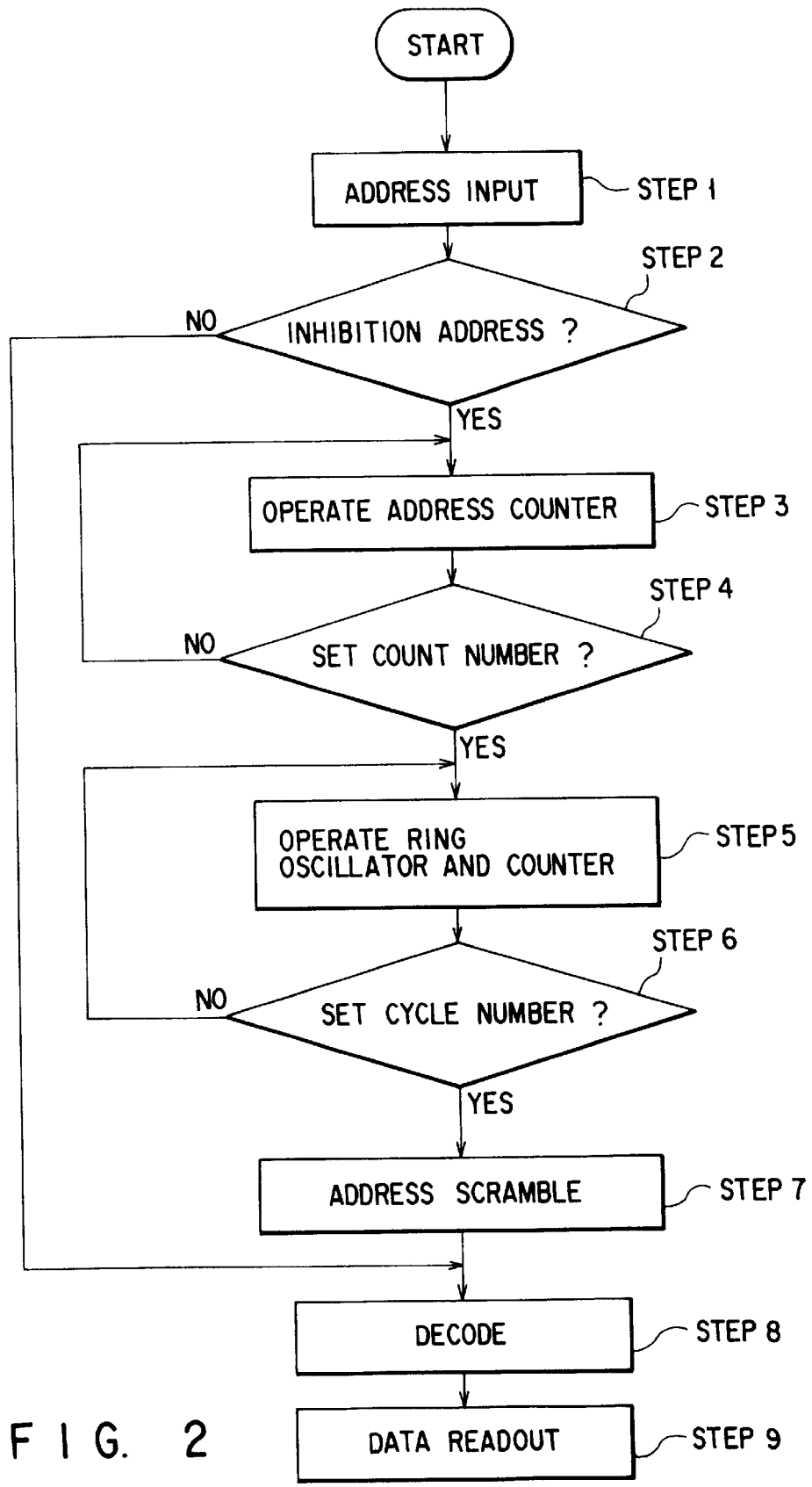
F I G. 2

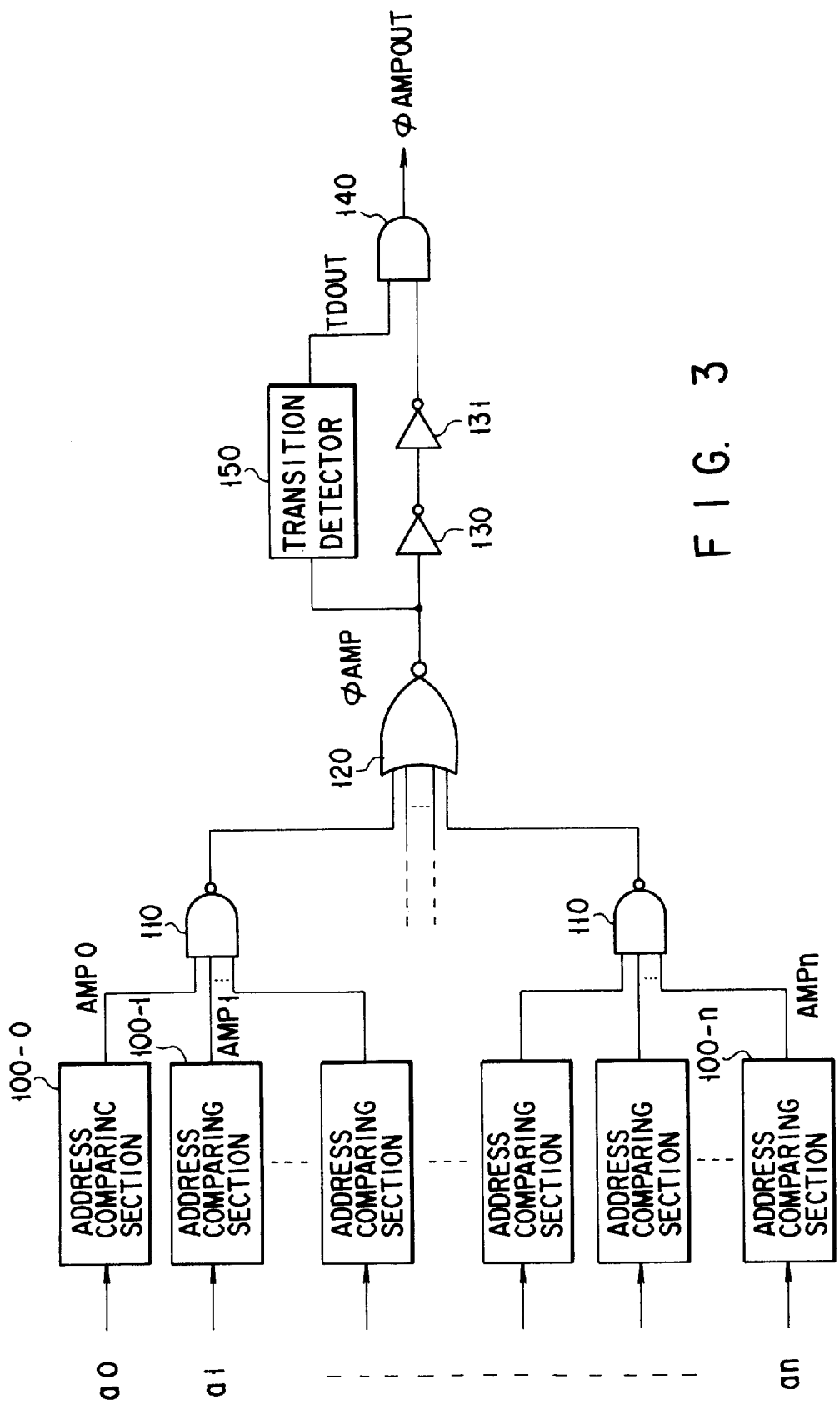
F I G. 3

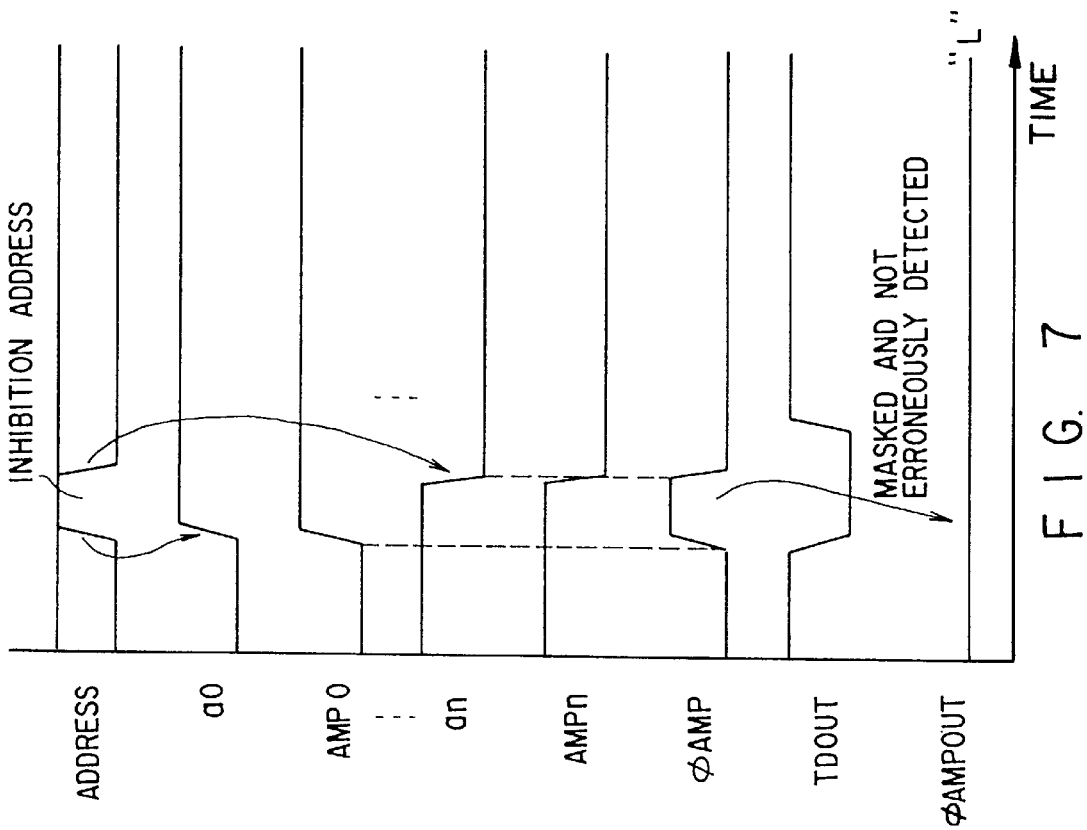
F I G. 7
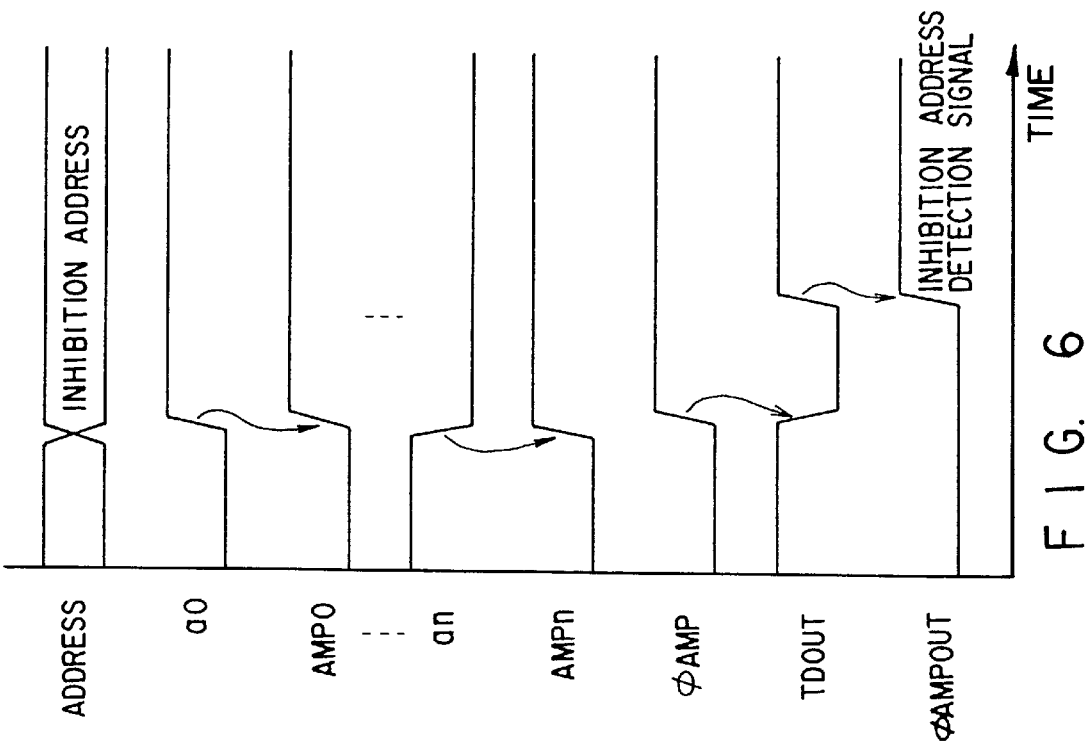
F I G. 6

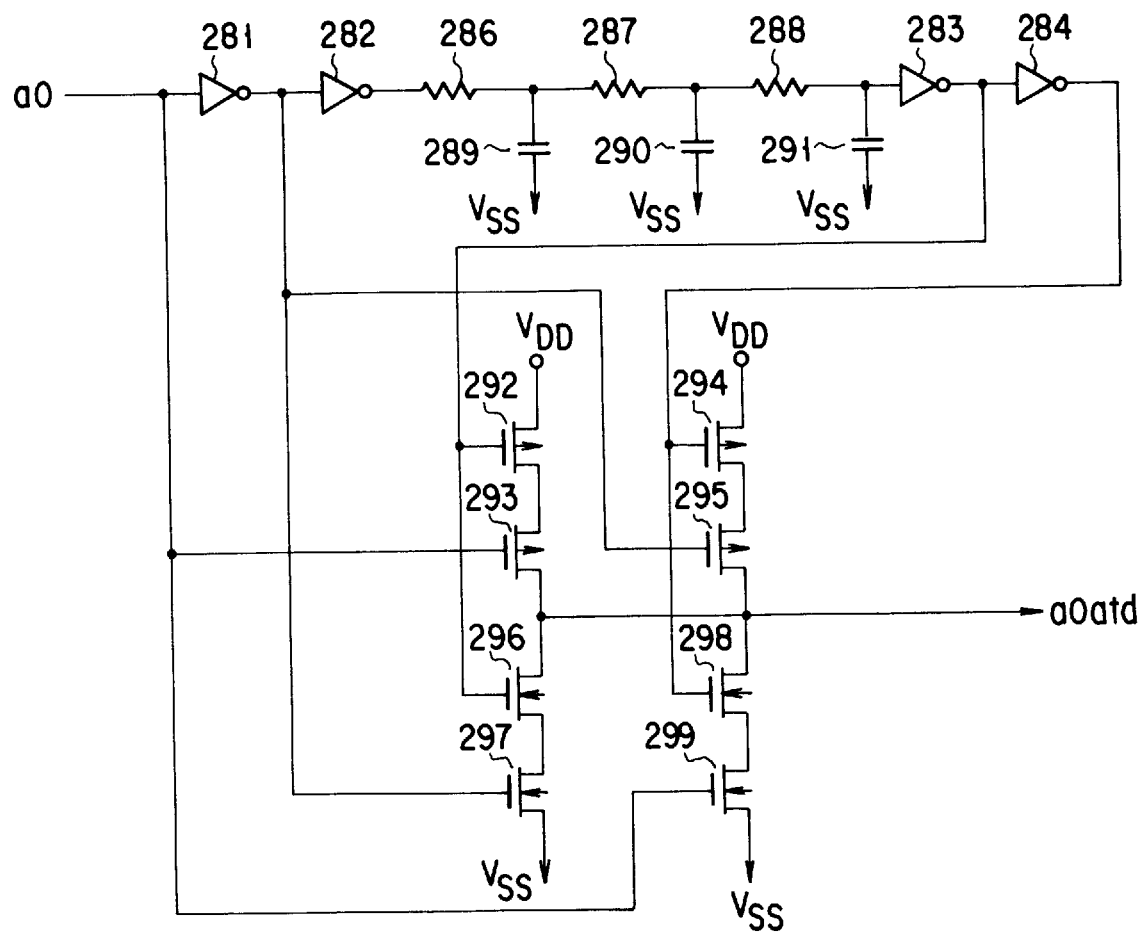
F I G. 11

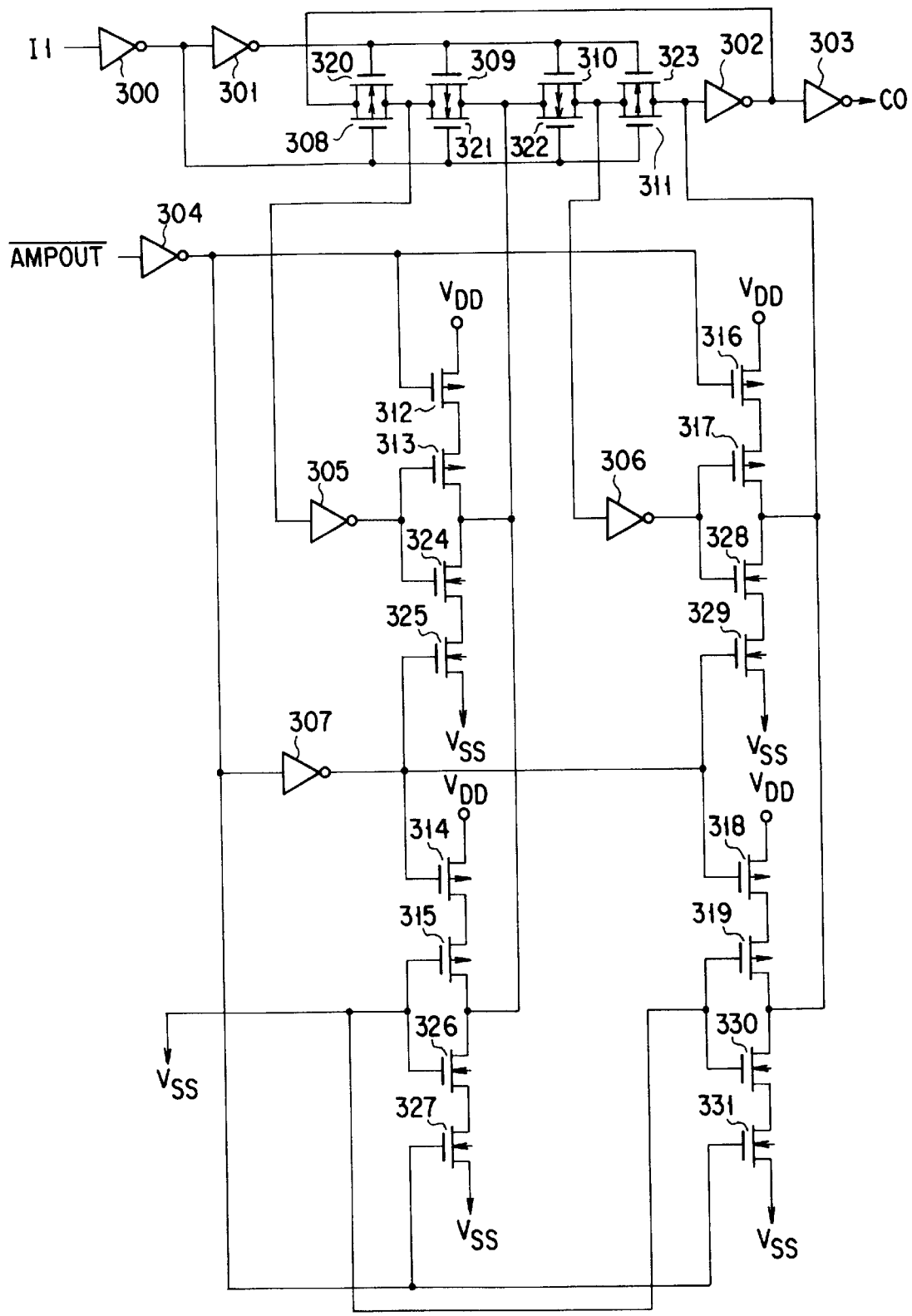
F I G. 12

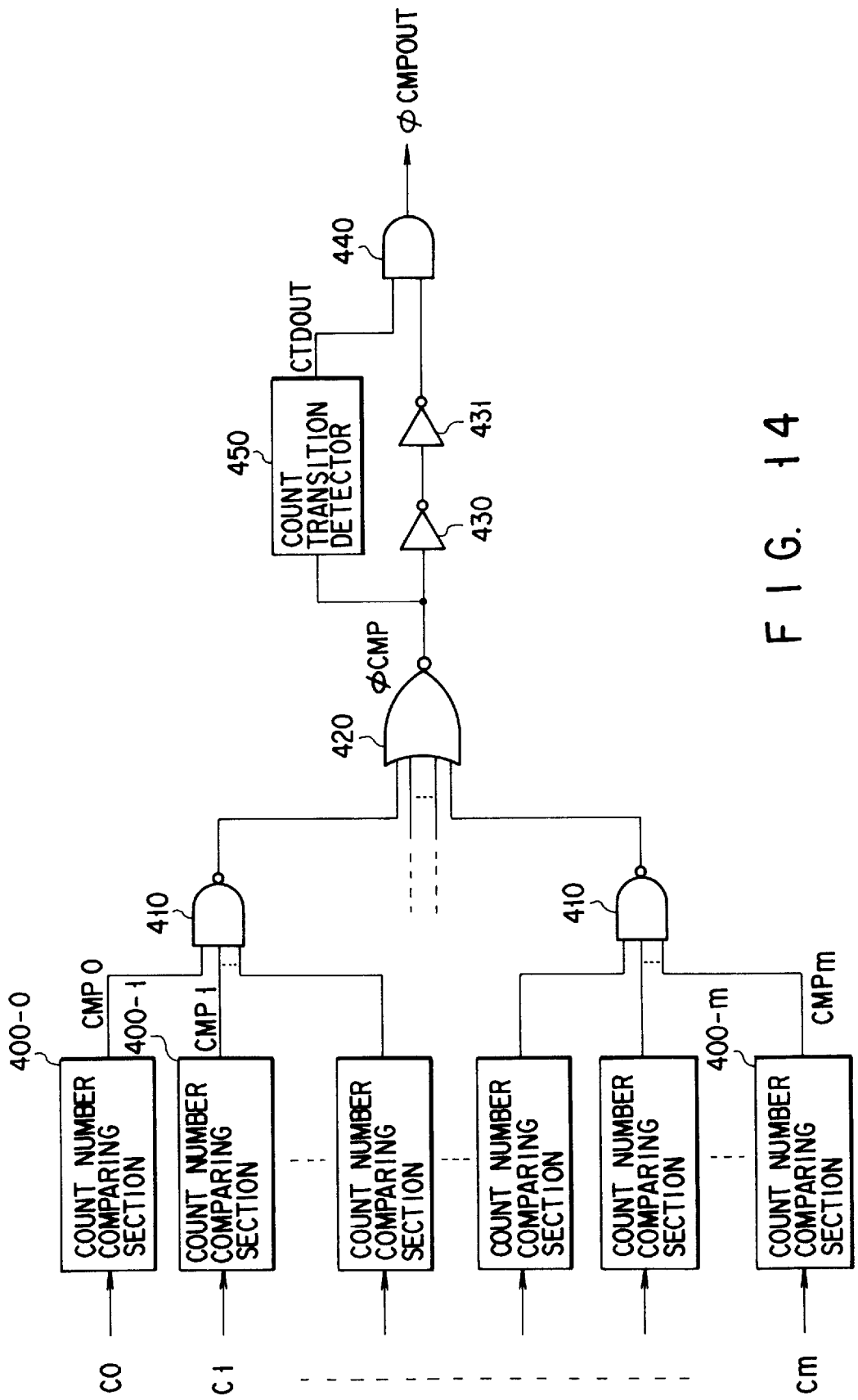
F I G. 14

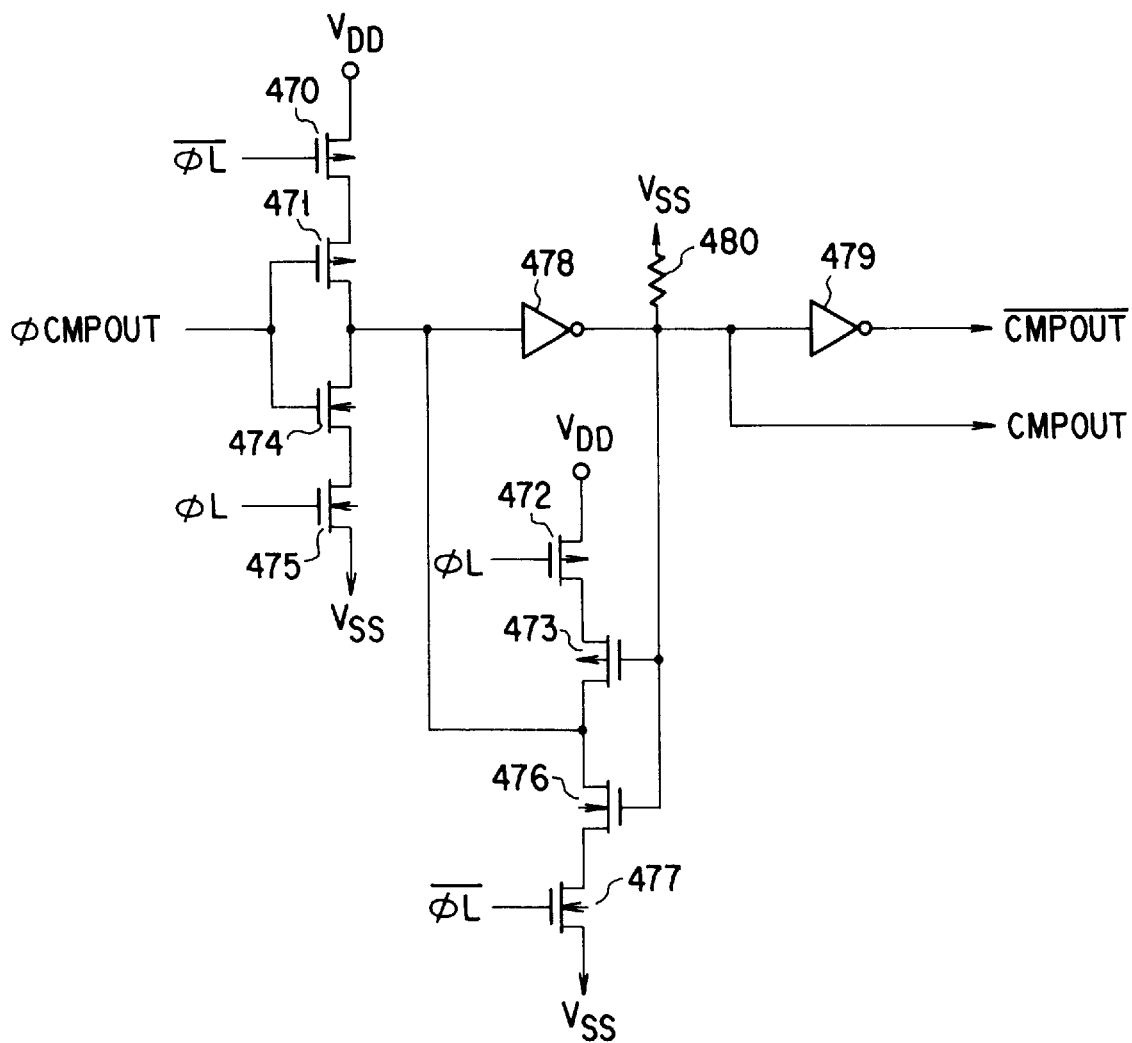
F I G. 17

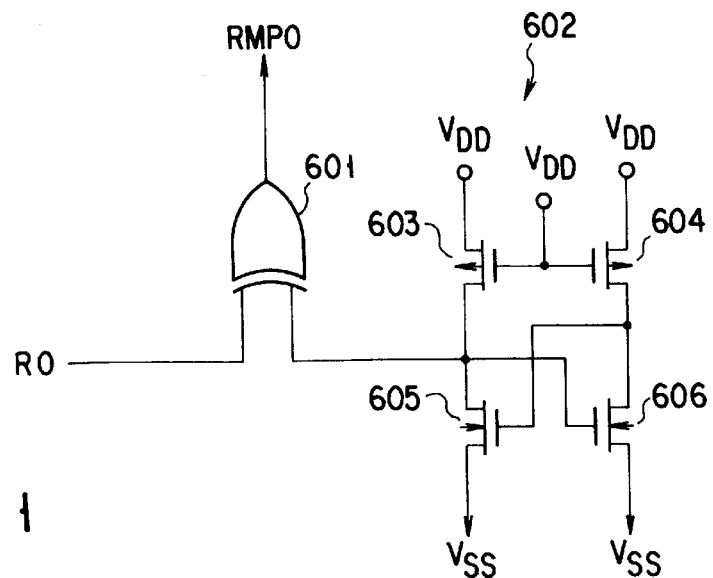
F I G. 21
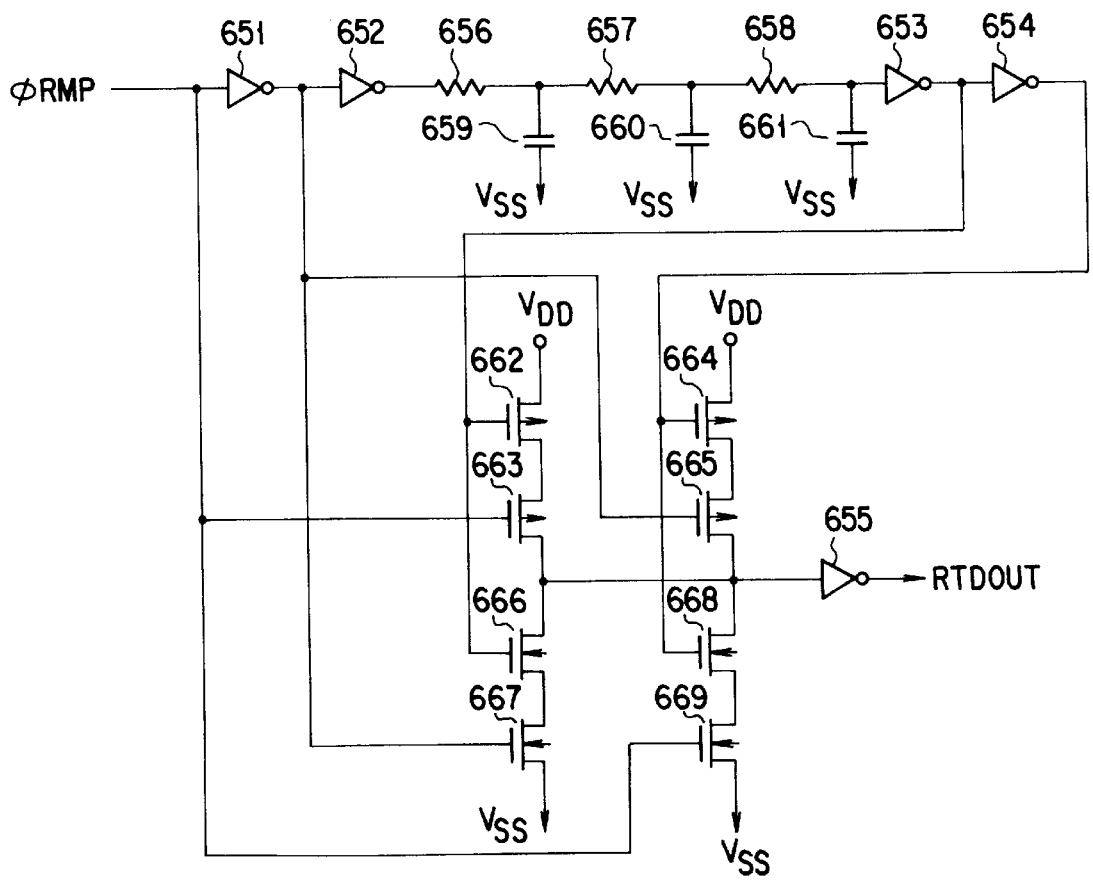
F I G. 22

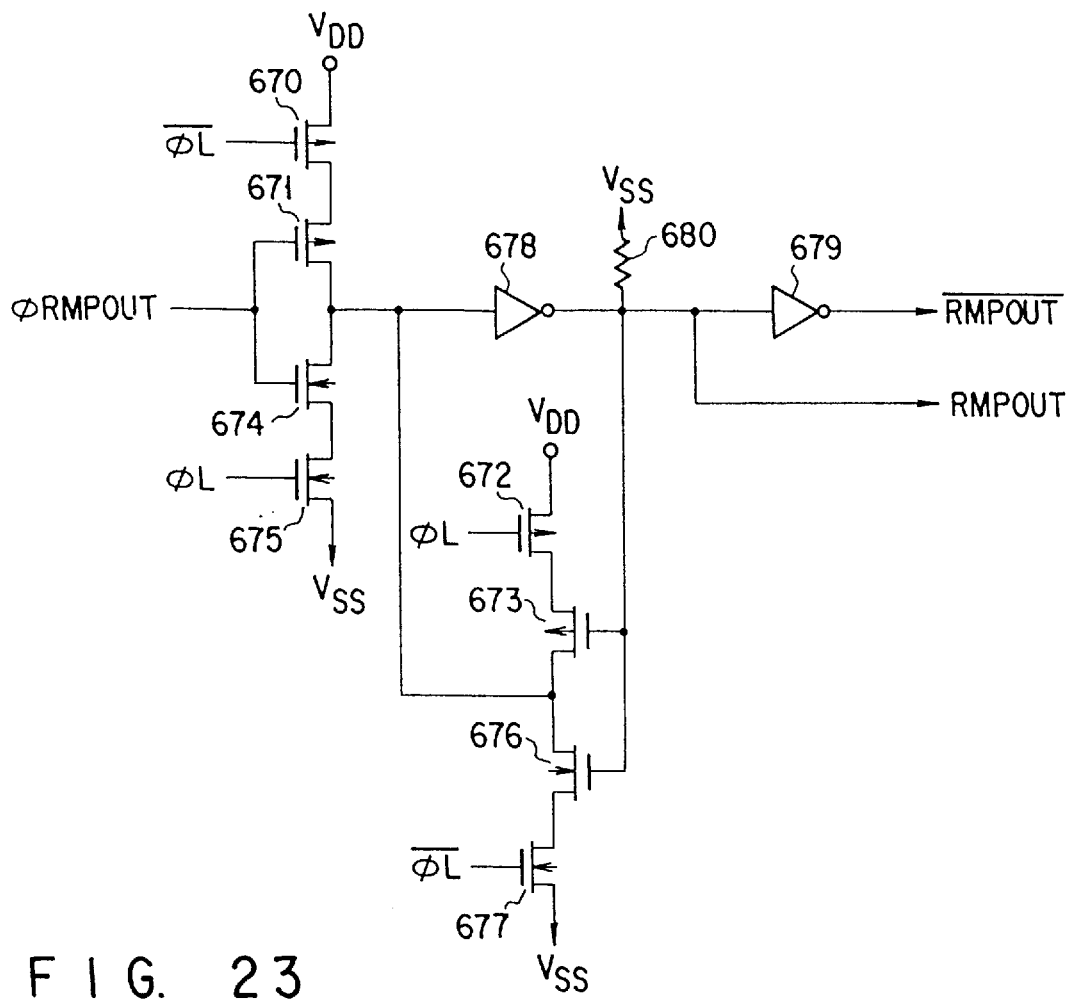
F I G. 23
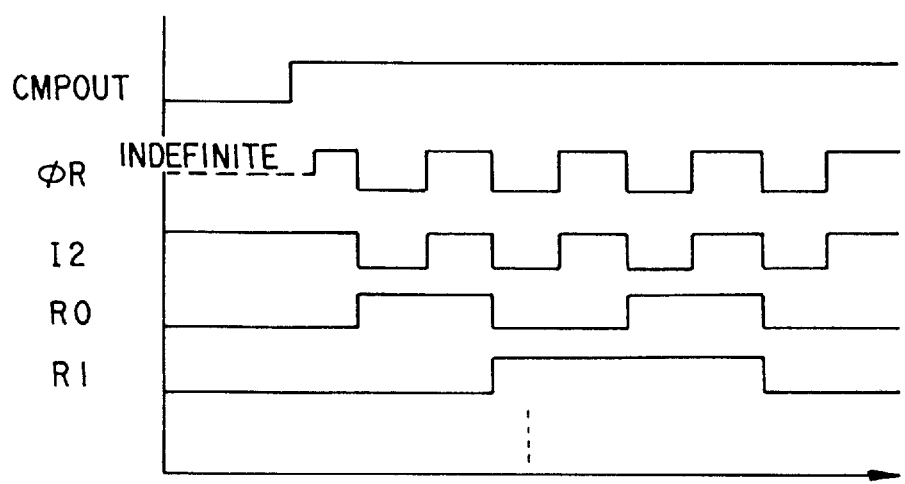
F I G. 24

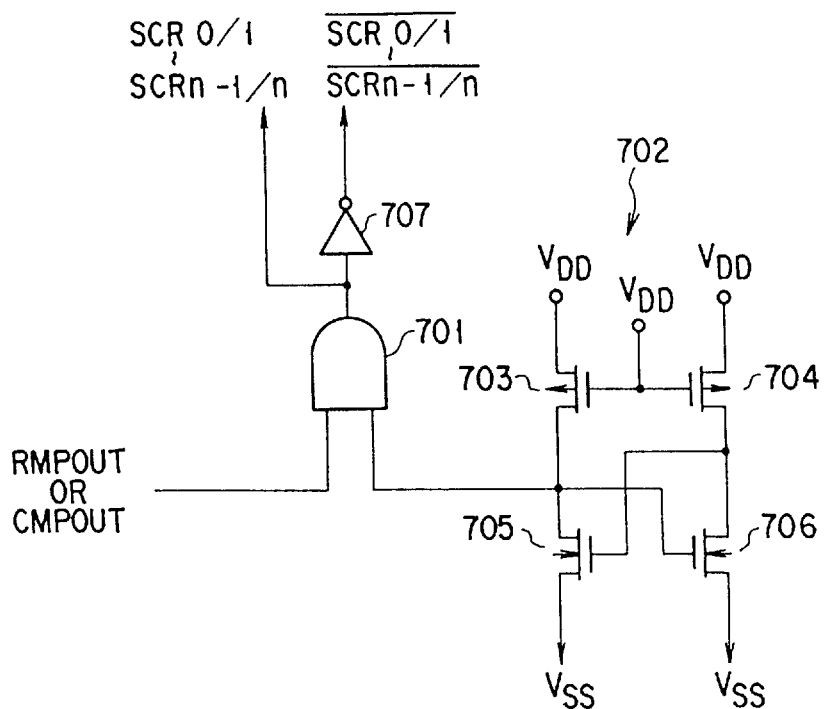
F I G. 25
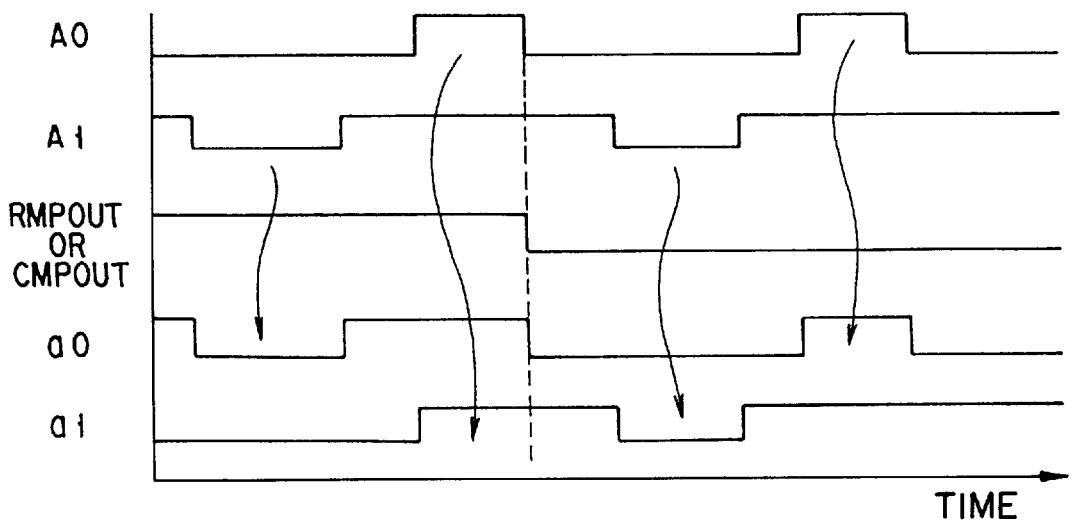
F I G. 27

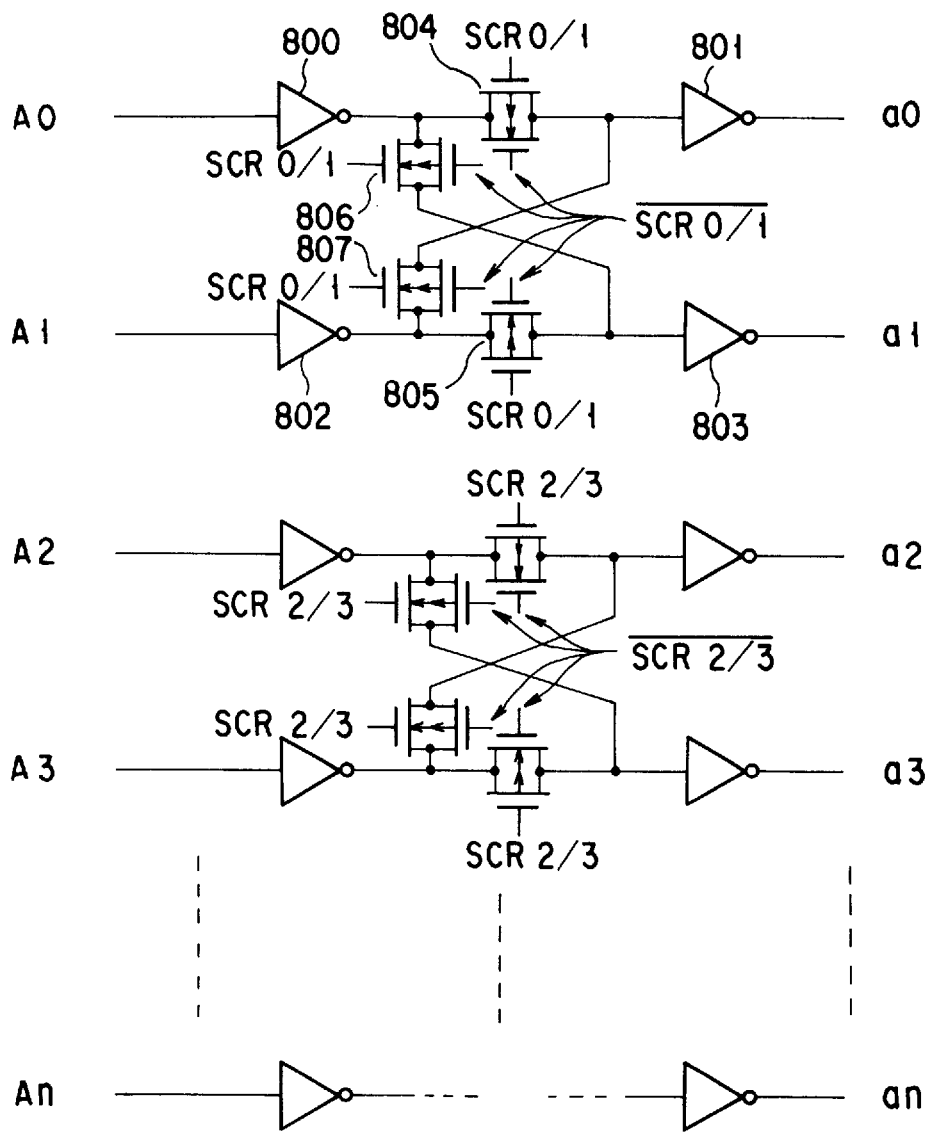
F I G. 26

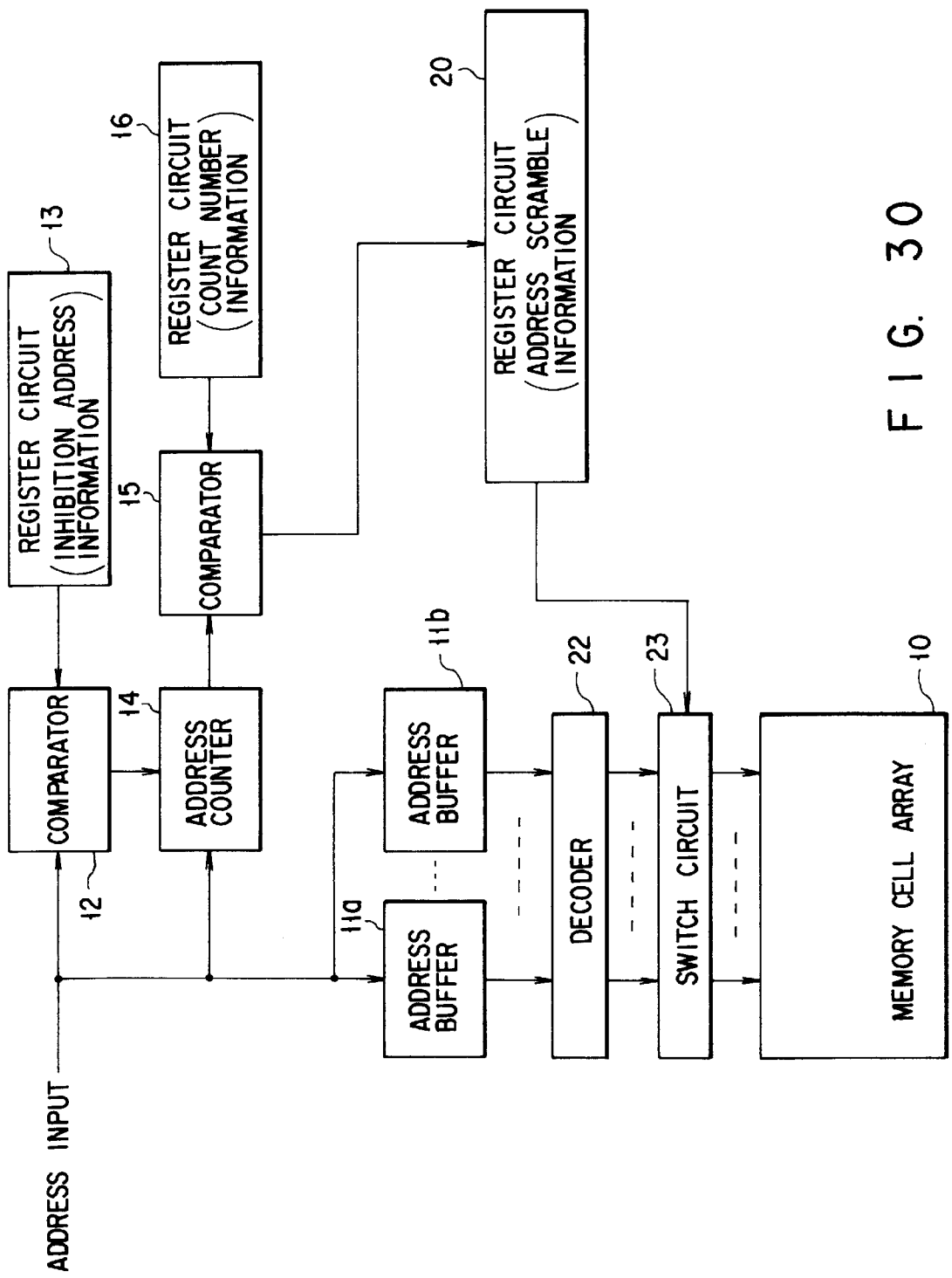
F I G. 30

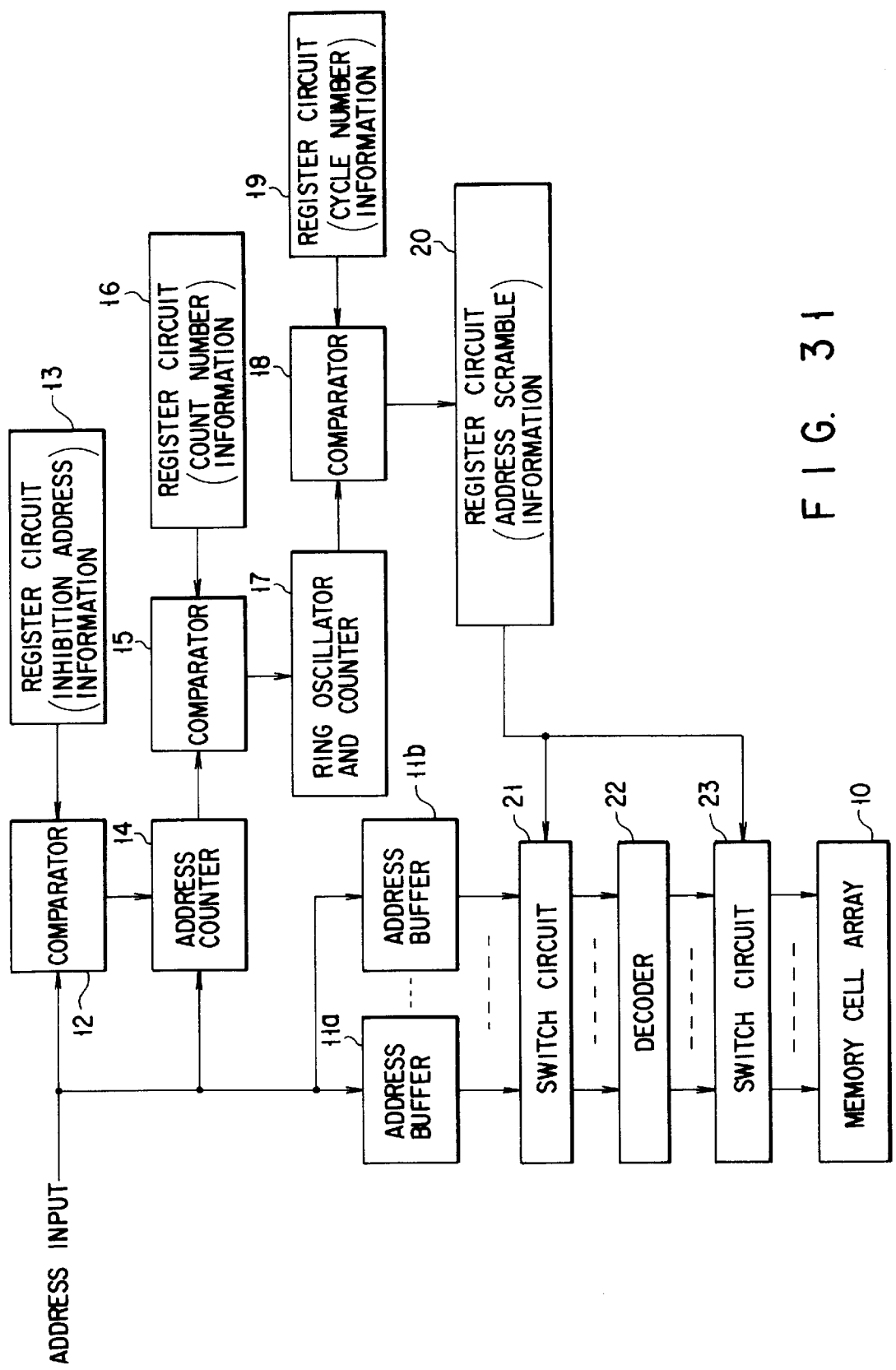
F I G. 31

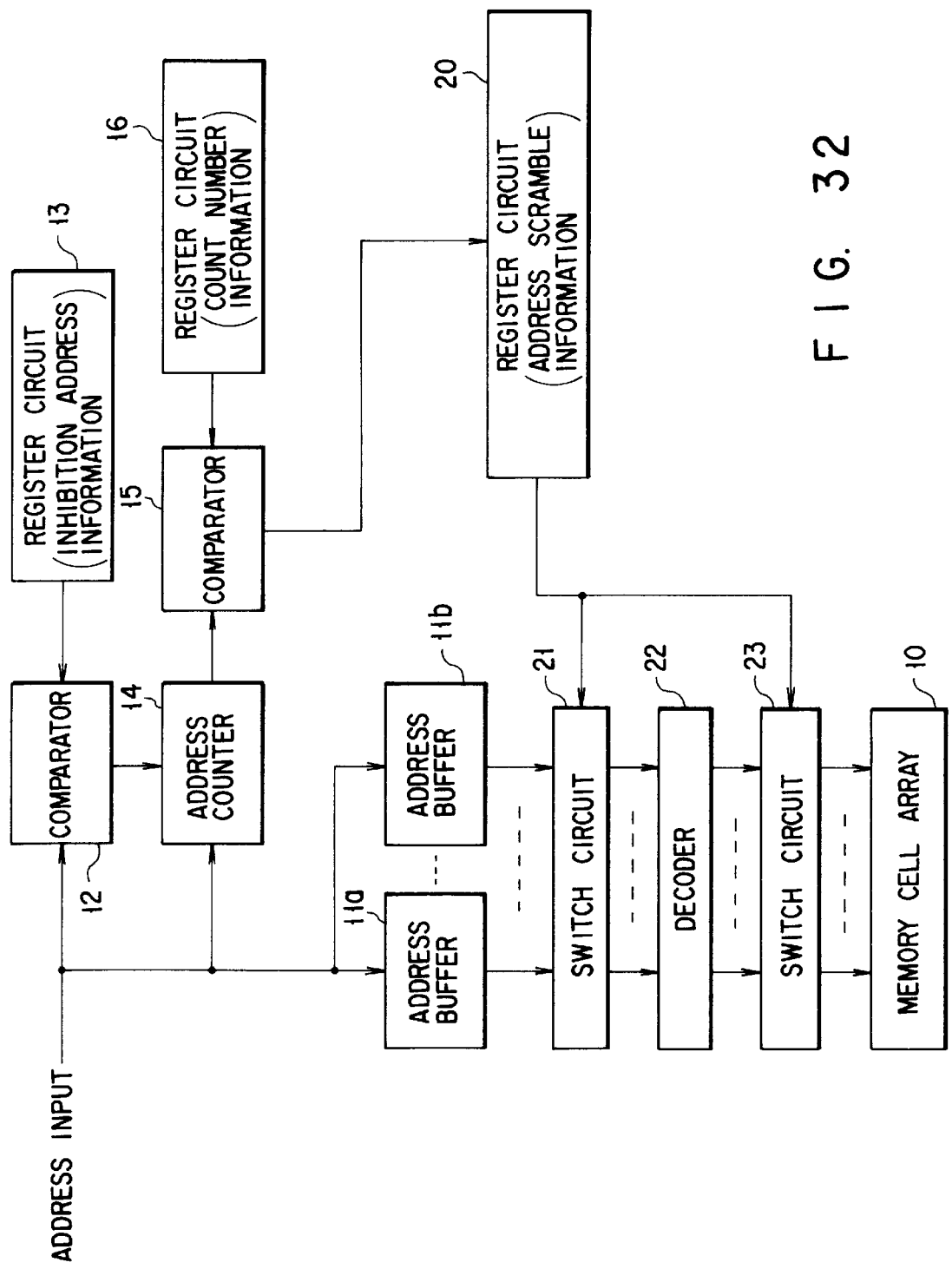
F I G. 32

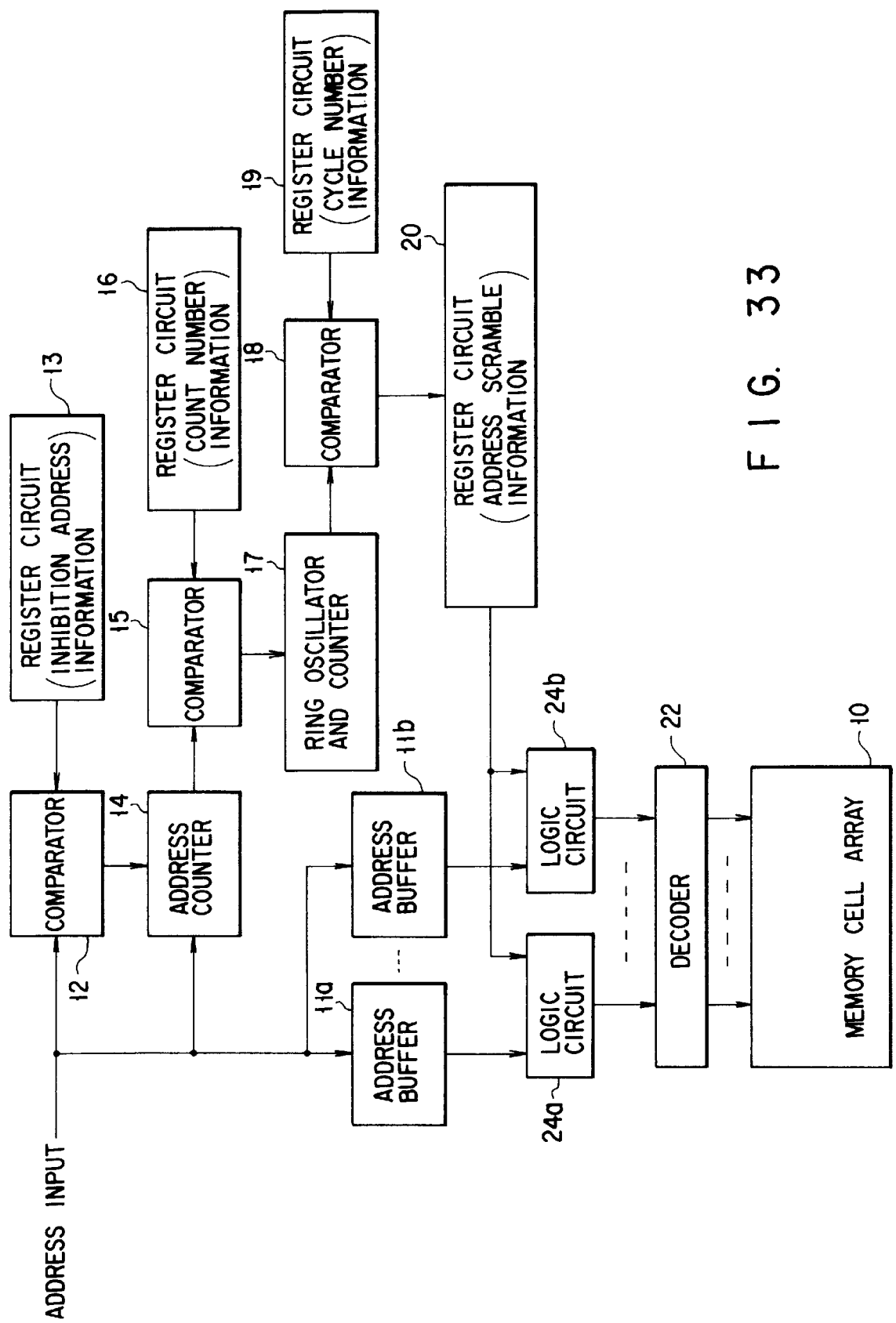
F I G. 33

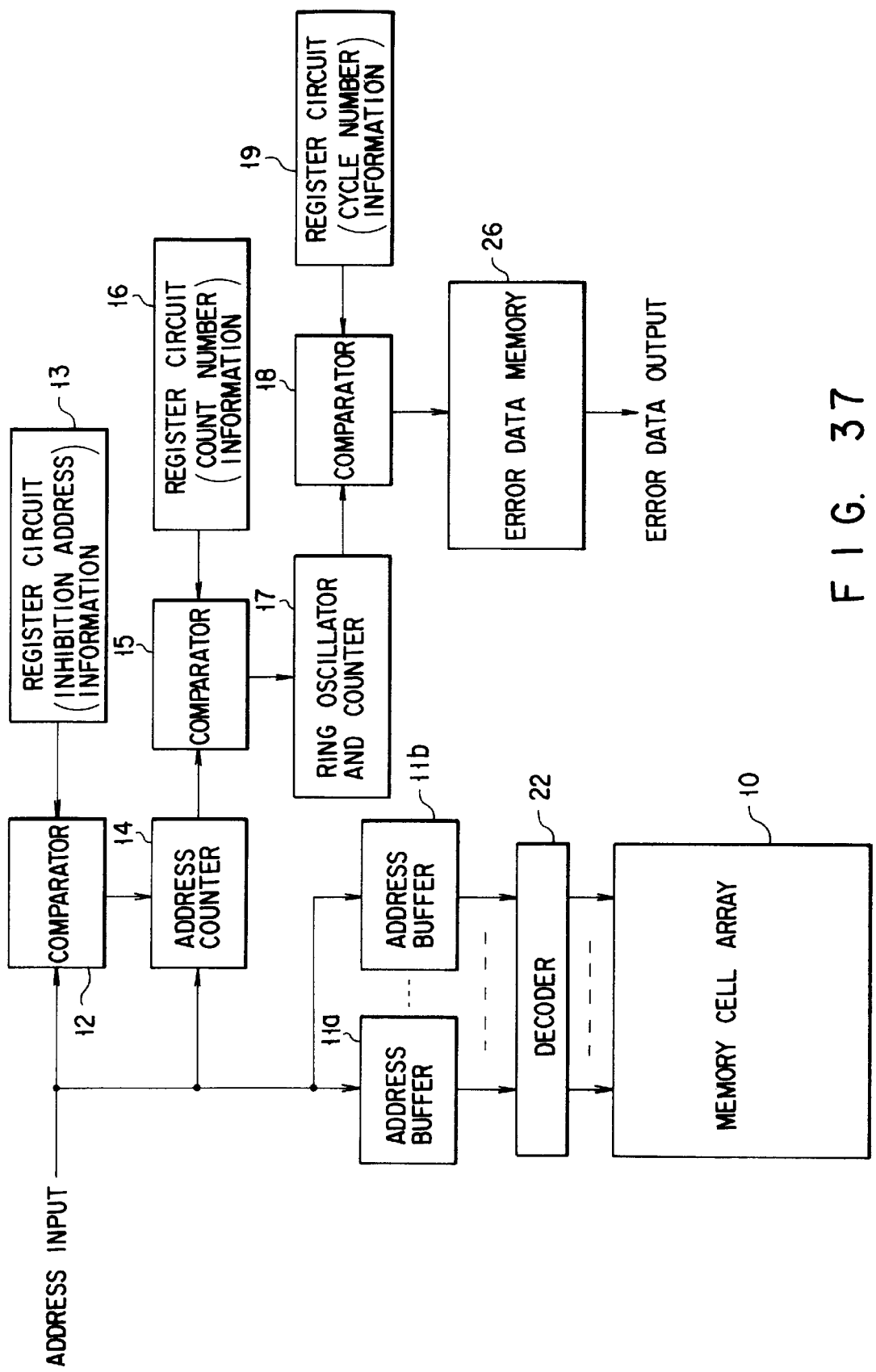
F I G. 37

SEMICONDUCTOR MEMORY DEVICE HAVING SECURITY FUNCTION

BACKGROUND OF THE INVENTION

1. Field of the Invention

This invention relates to a non-volatile semiconductor memory device having a security function for preventing storage data from being copied, and more particularly to a non-volatile semiconductor memory device having a security function suitable for protecting storage data of a ROM in which programs such as a general-purpose business software and a game software from being illegally copied.

2. Description of the Related Art

Generally, in a conventional non-volatile semiconductor memory device (ROM), since a security function for protecting stored data is not provided, the data can be relatively easily copied by use of a device having a data copying function, for example, an EPROM writer. Therefore, since it becomes possible to purchase a least and sufficient number of ROMs and produce a large number of copies, the practical value of the ROM is lowered. Further, even if a security function is provided in the ROM, the mechanism of the security function may be easily decoded by reading out stored data and checking the readout data.

Thus, the conventional non-volatile semiconductor memory device has a problem that the stored data can be easily copied and cannot be sufficiently protected even if a security function is attached thereto.

SUMMARY OF THE INVENTION

Accordingly, an object of this invention is to provide a non-volatile semiconductor memory device having a high-degree security function.

Further, another object of this invention is to provide a non-volatile semiconductor memory device capable of preventing the infringement of copyright by program copying and substantially illegal copying acts by outputting error data different from stored data when an attempt is made to copy the stored data and inhibiting the program from being correctly executed by use of the copied data.

The above objects of this invention can be attained by a non-volatile semiconductor memory device comprising a first comparing circuit for comparing an input address with a previously stored access inhibition address; a first counter circuit for counting the number of changes of addresses input after detection of coincidence between the input address and the previously stored access inhibition address when the first comparing circuit detects that the input address coincides with the previously stored access inhibition address; a second comparing circuit for comparing the count number of the first counter circuit with a previously stored count number; an oscillation circuit for starting the oscillation when the second comparing circuit detects that the count number of the first counter circuit coincides with the previously stored count number; a second counter circuit for counting the cycle number of the oscillation circuit; a third comparing circuit for comparing the cycle number of the second counter circuit with a previously stored cycle number; and an output circuit for outputting data different from stored data corresponding to the input address when the third comparing circuit detects that the cycle number of the second counter circuit coincides with the previously stored cycle number.

With the above construction, when stored data is read out by sequentially accessing addresses, the data can be converted into error data different from the normal stored data and output, thereby making it possible to inhibit the program from being correctly executed by use of the copied data and substantially prevent the infringement of copyright by the copying act or the program copying act. Further, error data is not output immediately after the inhibition address is accessed, but correct data is output for a preset period of time, and therefore, even if the third party knows the presence of the inhibition address, it is difficult to specify the inhibition address.

Further, since the oscillation circuit is operated at the cycle irrespective of the readout cycle, it is almost impossible to specify the inhibition address even if an attempt is made to store the data into another storage medium and analyze the data because the delay time taken for the error data to be output varies according to the data readout cycle.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

FIG. 2 is a flowchart for illustrating the operation of the circuit shown in FIG. 1;

FIG. 3 is a circuit diagram showing an address comparator for comparing an input address with a previously stored access inhibition address to check whether the access inhibition address is accessed or not, for illustrating the more detail circuit of the non-volatile semiconductor memory device according to the first embodiment of this invention;

FIGS. 6 and 7 are timing charts showing the operation effected when the inhibition address is accessed in the circuit shown in FIGS. 3 to 5;

FIG. 11 is a circuit diagram showing an example of the construction of an address transition detector in the circuit of FIG. 8;

FIG. 12 is a circuit diagram showing an example of the construction of a counter section in the circuit of FIG. 8;

FIG. 14 is a circuit diagram showing a count number detection circuit for comparing the number of changes of addresses counted in the address counter shown in FIGS. 8 to 12 with the previously stored count number to check whether it has reached a preset count number;

FIG. 17 is a circuit diagram showing an example of the construction of a latch circuit for latching an output signal of the circuit of FIG. 14;

FIG. 21 is a circuit diagram showing an example of the construction of a cycle number comparing section in the circuit of FIG. 20;

FIG. 22 is a circuit diagram showing an example of the construction of a cycle number transition detector in the circuit of FIG. 20;

FIG. 23 is a circuit diagram showing an example of the construction of a latch circuit for latching an output signal of the circuit of FIG. 20;

FIG. 24 is a timing chart for illustrating the operation of the circuit shown in FIGS. 19 to 23;

FIG. 25 is a circuit diagram showing an example of the construction of a register circuit storing address scramble information;

FIG. 26 is a circuit diagram showing an example of the construction of a scramble circuit;

FIG. 27 is a timing chart for illustrating the operation of the circuit shown in FIGS. 24 to 26; and FIGS. 28 to 38 are block diagrams showing extracted circuit portions relating to the security function, for illustrating non-volatile semiconductor memory devices according to second to twelfth embodiments of this invention.

DETAILED DESCRIPTION OF THE PREFERRED EMBODIMENTS

Figure 1:
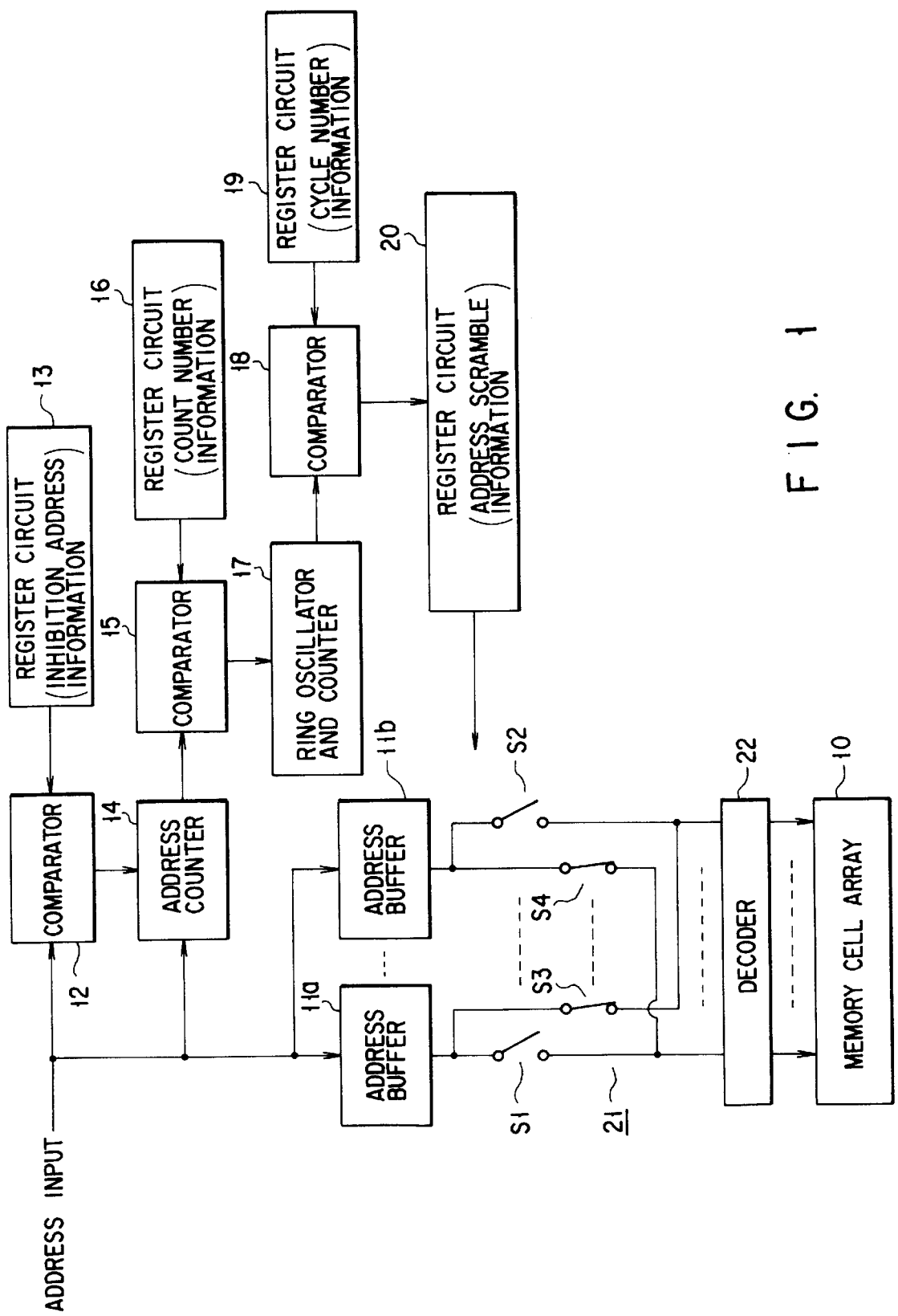
FIG. 1 is a block diagram of an extracted circuit portion relating to the security function, for illustrating a non-volatile semiconductor memory device according to a first embodiment of this invention.

FIG. 1 shows an extracted circuit portion relating to the security function in a mask ROM, for illustrating a non-volatile semiconductor memory device according to a first embodiment of this invention. An address input to the address input terminals from the exterior is supplied to address buffers 11a, 11b, and to one input terminal of a comparator 12. An output of a register circuit 13 is supplied to the other input terminal of the comparator 12. In the register circuit 13, at least one desired address (which is hereinafter referred to as an inhibition address) among addresses which are not used in the software (program) is previously stored by use of a ROM mask. In the ROM, since all of the addresses are not used in most cases and addresses which are not used are optional, they are unknown to a person who attempts to make a copy.

A comparison output of the comparator 12 is supplied to an address counter 14, and if coincidence of the two addresses is detected, the number of changes of addresses input after the coincidence of the addresses is counted by the address counter 14. The count number of the address counter 14 is input to one input terminal of a comparator 15. The other input terminal of the comparator 15 is supplied with an output of a register circuit 16. In the register circuit 16, a count number is previously stored by use of a ROM mask. A comparison output of the comparator 15 is supplied to a ring oscillator and counter 17, and if coincidence of the two count numbers is detected, the ring oscillator starts the oscillating operation and the cycle number thereof is counted by the counter. The ring oscillator oscillates at a desired frequency irrespective of the readout cycle of the memory and an output of the ring oscillator is counted by the counter. An output of the ring oscillator and counter 17 is supplied to one input terminal of a comparator 18. The other input terminal of the comparator 18 is supplied with an output of a register circuit 19. In the register circuit 19, a cycle number is previously stored by use of a ROM mask. A comparison output of the comparator 18 is supplied to a register circuit 20, and if coincidence of the two cycle numbers is detected, address scramble information is read out from the register circuit 20. In the register circuit 20, information (address scramble information) for converting the normal address to a desired type of address is previously stored by use of a ROM mask. In this example, it is supposed that a control signal (address scramble information) for switches S1, S2, S3, S4 for exchanging outputs of address buffers 11a and 11b for each other is stored.

The outputs of the address buffers 11a, 11b are supplied to a decoder 22 via a switch circuit 21. The switching state of the switch circuit 21 is controlled according to the address scramble information stored in the register circuit 20. For example, when a normal address is input (when an address other than the inhibition address is input), the switches S1, S2 are set ON and the switches S3, S4 are set OFF and the outputs of the address buffers 11a, 11b are supplied to the decoder 22 via the switches S1, S2. The output of the decoder 22 is supplied to a memory cell array 10 and stored data is read out from a memory cell corresponding to the input address. On the other hand, if the inhibition address is input, the switches S3, S4 are set ON and the switches S1, S2 are set OFF and the outputs of the address buffers 11a, 11b are supplied to the decoder 22 via the switches S3, S4. Therefore, the decoder 22 decodes an address different from the input address and stored data is read out from a memory cell which does not correspond to the input address.

As each of the above register circuits 13, 16, 19, 20, for example, a latch-type flip-flop circuit is used and one-bit data can be stored by selectively changing the threshold voltages of MOS transistors constructing the flip-flop circuit by use of a ROM mask. Therefore, by using a plurality of flip-flop circuits, a plural-bit register circuit can be obtained.

Next, the operation of the above construction is explained with reference to the flowchart of FIG. 2. Generally, when a copy is made, an attempt is made to read out ROM data for all of the addresses. Therefore, if the address which is not used in the software of the ROM is set as the inhibition address (access inhibition address), the copying operation can be recognized when the externally input address coincides with the inhibition address.

That is, when an address is input (STEP1), the input address is compared with the inhibition address stored in the register circuit by the comparator 12 to determine whether the input address is an inhibition address or not. If the input address is not an inhibition address, the address is supplied to the decoder 22 via the address buffers 11a, 11b and the switch circuit 21 (switches S1, S2) and decoded (STEP8). Then, data is read out from a memory cell of the memory cell array 10 which corresponds to the input address by the decode output of the decoder 22, and thus one cycle is completed (STEP9). After this, the same operation is effected and data corresponding to the input address is read out until the inhibition address is accessed.

On the other hand, if the two addresses input to the comparator 12 coincide with each other and input of the inhibition address is detected, the address counter 14 is operated to start the operation of counting the number of changes of addresses input after the coincidence (STEP3). The count number of the address counter 14 is compared with the count number stored in the register circuit 16 by the comparator circuit 15 (STEP4). Then, the counting operation is repeatedly effected until the compared count numbers coincide with each other. During the counting operation, that is, until the coincidence is detected by the comparator 12, an input address (which is not the inhibition address) is supplied to the decoder 22 via the address buffers 11a, 11b and switch circuit 21 and correct stored data is read out from a corresponding memory cell.

When the count number of the address counter 14 reaches the count number set in the register circuit 16, a coincidence signal is output from the comparator 15 to operate the ring oscillator and counter 17 (STEP5). The counter counts the cycle number of the ring oscillator and the cycle number is compared with the cycle number stored in the register circuit 19 by the comparator 18 (STEP6). In a period until the coincidence is detected in the comparator 18, the ring oscillator continues to oscillate and the cycle number is counted up by the counter. During the above period, the above-described correct readout of stored data is effected. Then, if the coincidence is detected, address scramble information is read out from the register circuit 20 and supplied to the switch circuit 21. The address scramble information corresponds to the ON/OFF states of the switches S1, S2, S3, S4 of the switch circuit 21, and in the case of the circuit shown in FIG. 1, the switches S1, S2 are set OFF and the switches S3, S4 are set ON according to the address scramble information. As a result, the output of the address buffer 11a and the output of the address buffer 11b are exchanged for each other and then supplied to the decoder 22 (STEP7).

At this time, the operation of transferring data different from normal ROM data to a medium which is a destination of copying after effecting a desired number of cycles from the inhibition address is started. Then, the decoder 22 decodes an address different from the input address (STEP8), data is read out from a memory cell of the memory cell array 10 which does not correspond to the input address as if it is correctly read out, and then one cycle is completed (STEP9). In the succeeding cycle, the decoder 22 is operated with the outputs of the address buffers 11a, 11b kept in the exchanged state by the switch circuit 21, error data different from input data is read out.

With the above construction, error data is not output immediately after the inhibition address is accessed, but error data is output with delay time of a period in which the count number of the address counter 14 reaches the count number stored in the register circuit 16 and a period in which the cycle number of the ring oscillator reaches the set cycle number after the above set count number is reached. Therefore, even if a person who wants to make an illegal copy knows the presence of the inhibition address, it is difficult for him to specify the inhibition address since correct data is output for a certain period after the inhibition address is accessed. Further, the ring oscillator oscillates at a frequency different from the readout cycle. Therefore, even if an attempt is made to store the data of the ROM into another storage medium such as a hard disk and then analyze it using an EPROM writer, a personal computer or the like as an analyzing means, the number of data items to be correctly read out varies unless the number of readout cycles of the analyzing means and that of cycles of the ring oscillator coincide with each other. It is thus extremely difficult to specify or analyze the inhibition address.

In a case where a single inhibition address is set in the circuit of FIG. 1, error data is output when a desired period of time or cycles has passed after the input of an inhibition address. Therefore, one correct copy product can be made by selecting the readout addresses by two different methods in which data items are sequentially read out from the least significant bit (LSB) address to the most significant bit (MSB) one and from the MSB address to the LSB one, and adding only the correct data items together, in other words, combining data items from the LSB address until error data is output and those from the MSB address until the error data is output. Therefore, if two or more inhibition addresses are provided, a data portion between the two inhibition addresses cannot be correctly copied by use of the above method unless the data portion is fetched while checking whether the data portion is correct or not for each data item. The method of fetching data one at a time is not practical since the storage capacity of the ROM is extremely large at present. Therefore, it is practically impossible to make a copy. If three or more inhibition addresses are used, decoding of the inhibition addresses becomes more difficult, and thus it becomes more difficult to specify or decode the inhibition addresses as the number of inhibition addresses is increased. But if the number of inhibition addresses is increased, the circuit scale must be enlarged, and therefore, it is preferable to set an adequate number of inhibition addresses based on the necessary protection effect.

In the first embodiment, for simplifying the explanation, a case wherein the oscillation frequency of the ring oscillator is constant is explained, but it is possible to make the decoding more difficult by setting the oscillation frequency variable, previously storing the oscillation frequency in the register circuit 19, and effecting the scrambling of the address when not only the cycle number but also the oscillation frequency coincides.

Next, the more detail circuit construction and operation of the first embodiment are explained with reference to FIGS. 3 to 27.

Figure 4:
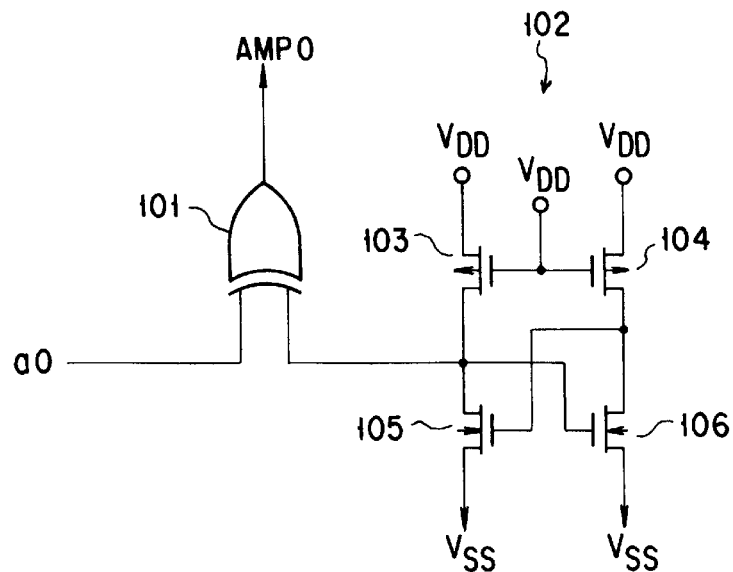
FIG. 4 is a circuit diagram showing an example of the construction of an address comparing section in the circuit of FIG. 3.
Figure 5:
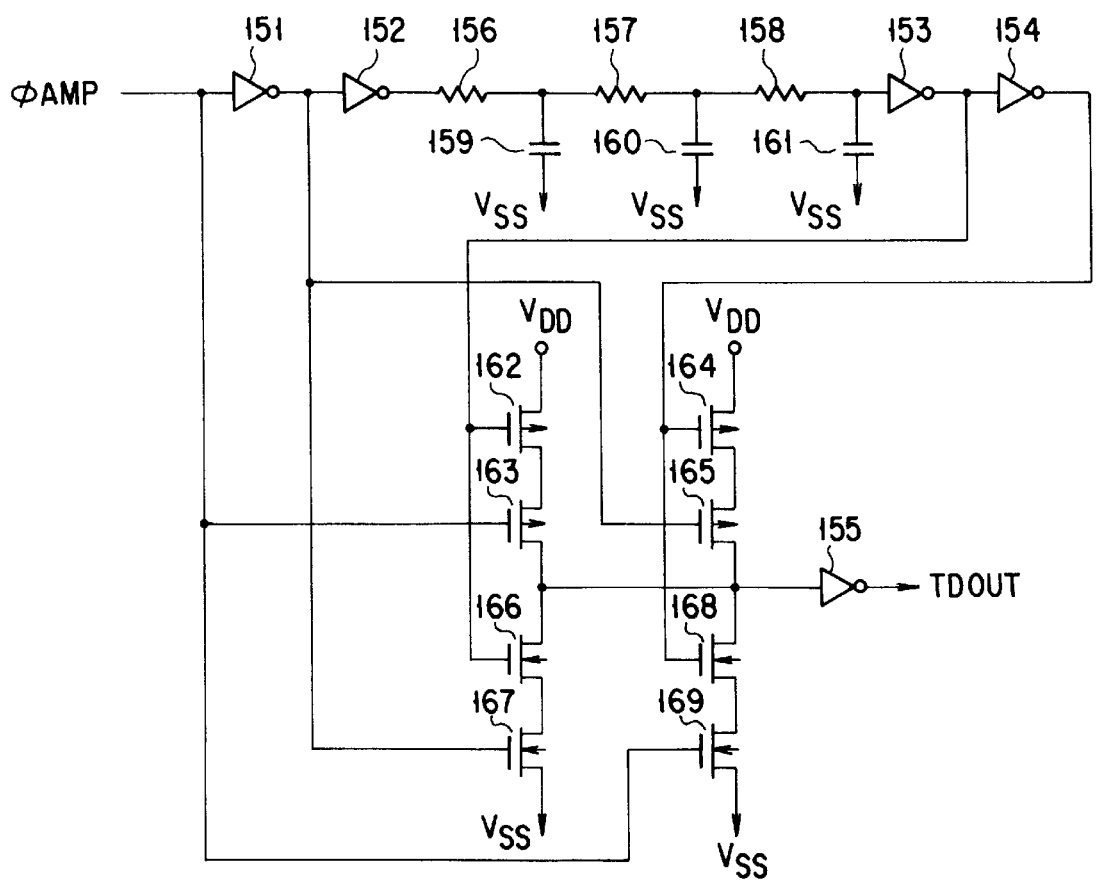
FIG. 5 is a circuit diagram showing an example of the construction of a transition detector in the circuit of FIG. 3.

FIG. 3 shows an address comparator for comparing an input address with a previously stored access inhibition address to check whether the access inhibition address is accessed or not, and each address comparing section corresponds to the comparator 12 and register circuit 13 of the circuit shown in FIG. 1. FIG. 4 shows an example of the construction of the address comparing section in the circuit of FIG. 3, and FIG. 5 shows an example of the construction of a transition detector in the circuit of FIG. 3. As shown in FIG. 3, the address comparing sections 100-0, 100-1, - - - , 100-n are supplied with address bits a0, a1, - - - , an for each bit and the address bits are compared with respective bits of a previously stored access inhibition address. Comparison outputs AMP0, AMP1, AMPn of the address comparing sections 100-0, 100-1, - - - , 100-n are supplied to NAND gates 110, - - - , 110 for every preset number of bits. Output signals of the NAND gates 110, - - - , 110 are supplied to a NOR gate 120. With this connection, if the input address bits a0, a1, - - - , an respectively coincide with all of the bits of the inhibition address, a signal $\phi_{AMP}$ of "H" level is output from the NOR gate 120. The signal $\phi_{AMP}$ is supplied to one input terminal of a AND gate 140 via inverters 130, 131 for delay, and to the input terminal of a transition detector 150. The transition detector 150 detects a variation in the signal $\phi_{AMP}$ output from the NOR gate 120 to create a rectangular pulse signal TDOUT with a preset width and supply the same to the other input terminal of the AND gate 140. An inhibition address detection signal $\phi_{AMPOUT}$ is output from the output terminal of the AND gate 140.

The address comparing section 100-0 has an exclusive-OR gate 101 and a latch circuit 102 as shown in FIG. 4. The address bit a0 is supplied to one input terminal of the exclusive-OR gate 101 and an output of the latch circuit 102 is supplied to the other input terminal thereof. The latch circuit 102 includes P-channel MOS transistors 103, 104 and N-channel MOS transistors 105, 106. The sources and gates of the MOS transistors 103, 104 are connected to a power supply $V_{DD}$. The drain of the MOS transistor 105 is connected to the drain of the MOS transistor 103 and the other input terminal of the exclusive-OR gate 101, the source thereof is connected to a ground node Vss, and the gate thereof is connected to the drain of the MOS transistor 104. The drain of the MOS transistor 106 is connected to the drain of the MOS transistor 104, the source thereof is connected to the ground node Vss, and the gate thereof is connected to the drain of the MOS transistor 103 and the other input terminal of the exclusive-OR gate 101. Impurity such as boron is ion-implanted into the channel region of one of the P-channel MOS transistors 103, 104 according to the inhibition address so as to form a depletion type. For example, when the inhibition address bit is "1" level, the MOS transistor 103 is made to a depletion type, and when the inhibition address bit is "0" level, the MOS transistor 104 is made to a depletion type. As a result, a signal of "1" level or "0" level corresponding to the inhibition address bit is supplied to the other input terminal of the exclusive-OR gate 101 and is compared with the address bit a0 which is supplied to the one input terminal thereof to check the coincidence thereof. A signal AMP0 output from the exclusive-OR gate 101 is supplied to the NAND gate 110.

The other address comparing sections 100-1, - - - , 100-n also have the same construction as the address comparing section 100-0. If all of the bits of the address coincide, outputs of the NAND gates 110 are set to the "L" level. As a result, the output signal (coincidence detection signal) $\phi_{AMP}$ of the NOR gate 120 is raised to the "H" level to detect the coincidence of the input address bits a0, a1, - - - , an and the previously stored inhibition address bits.

FIG. 5 shows an example of the construction of the transition detector 150 in the circuit of FIG. 3. The transition detector 150 includes inverters 151 to 155, resistors 156 to 158, capacitors 159 to 161, P-channel MOS transistors 162 to 165, and N-channel MOS transistors 166 to 169. The resistors 156 to 158 and the capacitors 159 to 161 construct a delay circuit and the "H" level period of the rectangular pulse signal TDOUT output from the inverter 155 is determined by the CR time constant of the delay circuit constructed by the resistors 156 to 158 and the capacitors 159 to 161. The delay time of the delay circuit is set to a value larger than a time difference caused by the skew of a variation in the address. The MOS transistors 162 to 169 and the inverter 155 construct an exclusive-OR gate and the output signal thereof is set to the "L" level in a period in which the output signal $\phi_{AMP}$ of the NOR gate 120 supplied to the input terminal of the inverter 151 is not coincident with the signal delayed by the delay circuit.

The transition detector 150 temporarily makes the coincidence detection signal $\phi_{AMP}$ output from the NOR gate 120 invalid. That is, when a skew between signals supplied to the address input terminals of the mask ROM and a skew due to the delay on the wiring in the IC are caused, the input address may temporarily coincide with the access inhibition address by the skew. Therefore, a design is made to prevent that the access inhibition address is temporarily accessed to operate the security circuit when the user effects the operation based on the correct application method. When the inhibition address is accessed by the dishonest copying act, it is accessed for a longer period of time in comparison with a case where it is temporarily accessed by the skew, and therefore, the circuit will not be erroneously operated even if the operation is effected by the user based on the correct application method and the dishonest copying act can be stably detected.

FIGS. 6 and 7 are timing charts showing the operation effected when the inhibition address is accessed in the circuit shown in FIGS. 3 to 5. FIG. 6 shows a case wherein no skew occurs in the address and FIG. 7 shows a case wherein a skew occurs in the address. As shown in FIG. 6, when no skew occurs in the address and if the address bits a0, a1, - - - , an vary and the inhibition address is accessed, the output signals AMP0, AMP1, - - - , AMPn of the exclusive-OR gates 101 for the respective bits are set to the "H" level. As a result, the output signal $\phi_{AMP}$ of the NOR gate 120 is set to the "H" level and the output signal TDOUT of the transition detector 150 is set to and kept at the "L" level for a preset period of time in response to the rise of the signal $\phi_{AMP}$. When the signal TDOUT rises to the "H" level after the passage of a preset period of time, the inhibition address detection signal $\phi_{AMPOUT}$ output from the AND gate 140 is set to the "H" level in response to the rise of the signal TDOUT and thus access to the inhibition address is detected.

On the other hand, when a skew occurs in the address as shown in FIG. 7 (in this example, a case wherein a variation in the address bit an is delayed with respect to that of the address bit a0 is shown), the output signal AMP0 of the address comparing section is set to the "H" level in response to the variation in the address a0, and the output signal AMPn of the address comparing section is set to the "L" level in response to the variation in the address an with the preset delay time. At this time, in a period from the time when the signal AMP0 is raised to the "H" level until AMPn is lowered to the "L" level, the signals AMP0 and AMPn are both set to the "H" level (it is supposed that the other bit signals AMP1 to AMP(n-1) are also set at the "H" level) and the output signal $\phi_{AMP}$ of the NOR gate 120 is set to the "H" level. The output signal TDOUT of the transition detector 150 is set to the "L" level in response to the rise of the signal $\phi_{AMP}$ and is returned to the "H" level after the delay time of the delay circuit constructed by the resistors 156 to 158 and the capacitors 159 to 161. As a result, a variation in the signal $\phi_{AMP}$ in the delay time of the delay circuit is not output from the AND gate 140 and the inhibition address detection signal $\phi_{AMPOUT}$ is maintained at the "L" level. In other words, when the input address coincides with the inhibition address by the presence of skew, a variation in the signal $\phi_{AMP}$ of the NOR gate 120 is masked and is not output from the AND gate 140.

Figure 8:
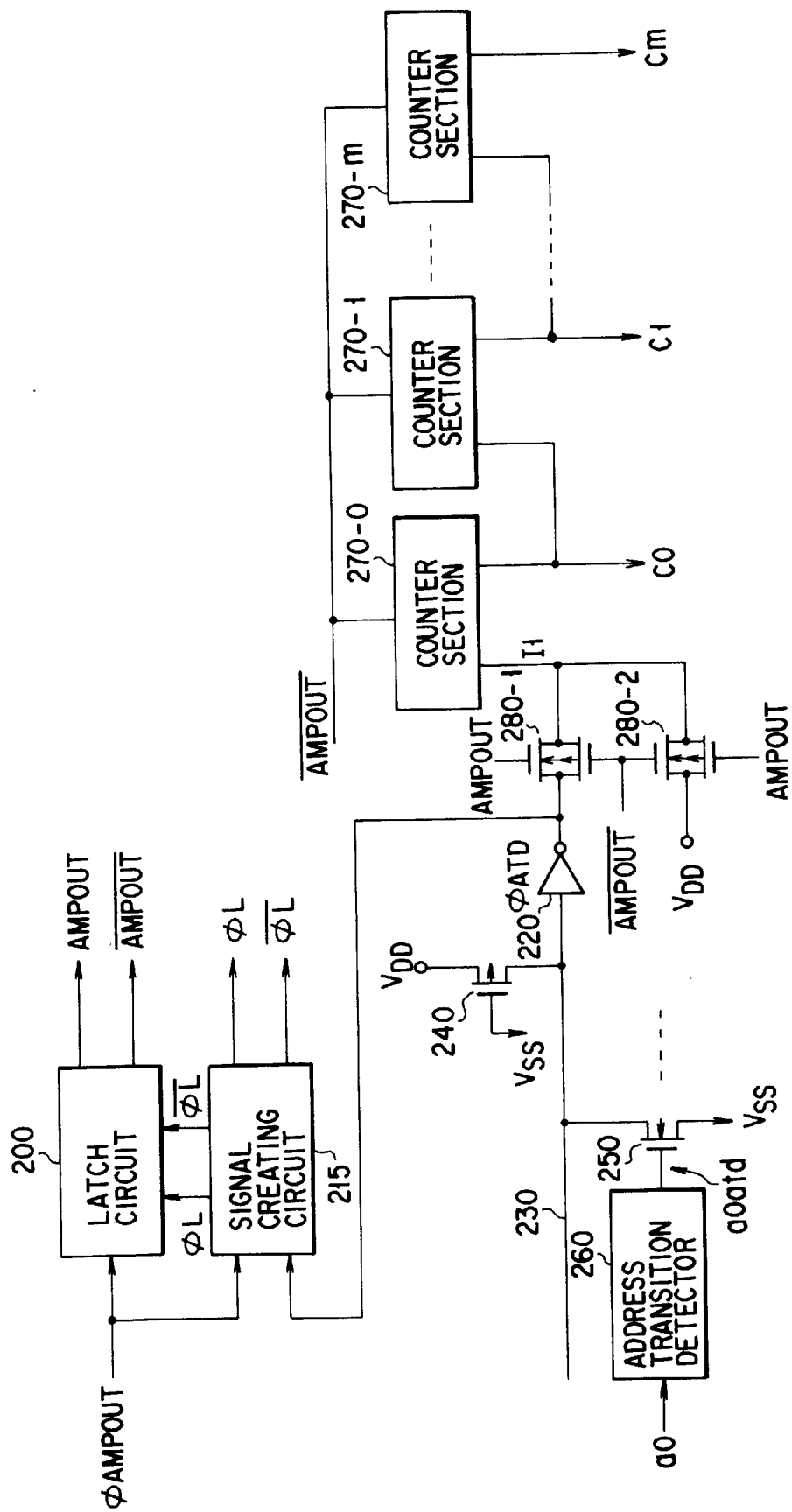
FIG. 8 is a circuit diagram showing an example of the construction of an address counter for counting the number of input addresses after coincidence of the input address and the access inhibition address when the input address coincides with the access inhibition address.
Figure 9:
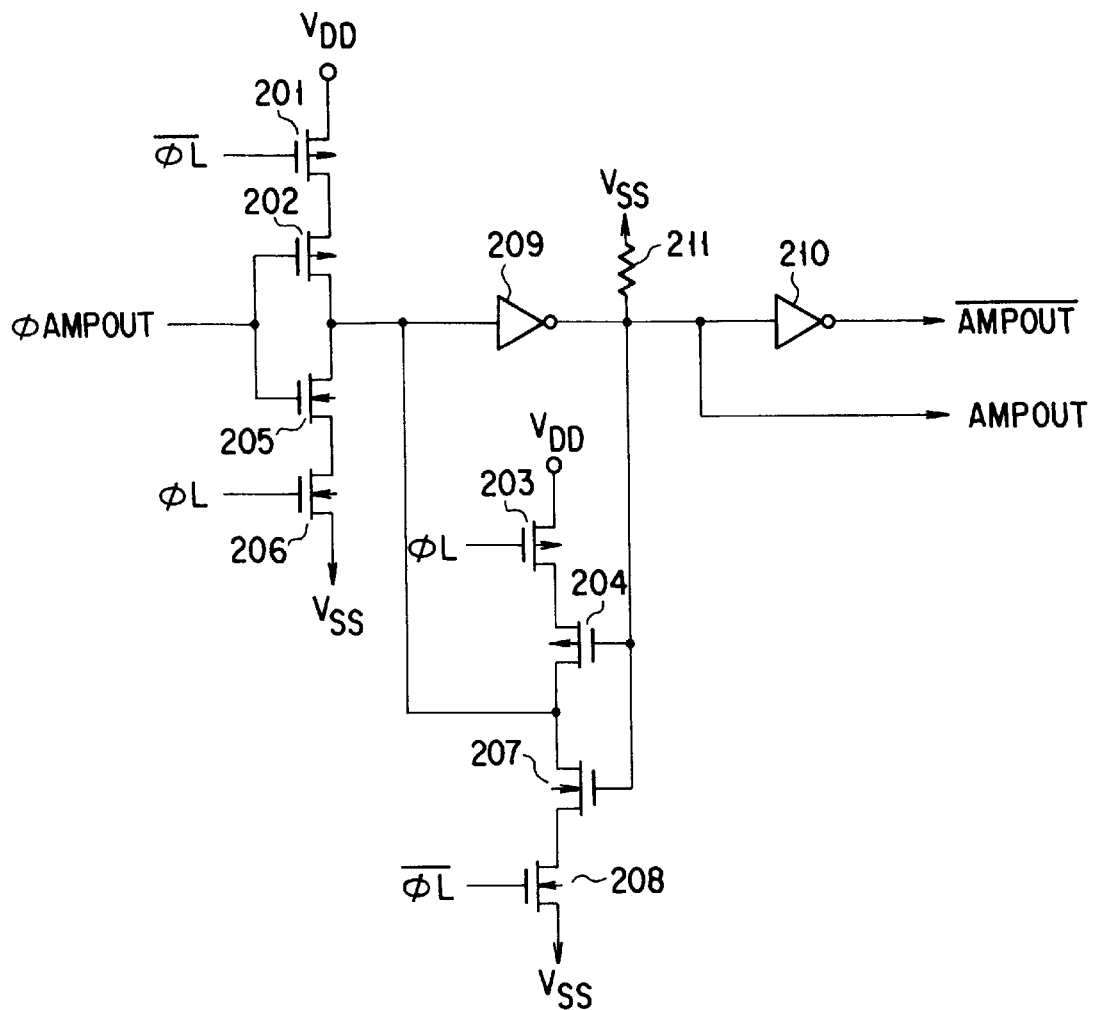
FIG. 9 is a circuit diagram showing an example of the construction of a latch circuit in the circuit of FIG. 8.
Figure 10:
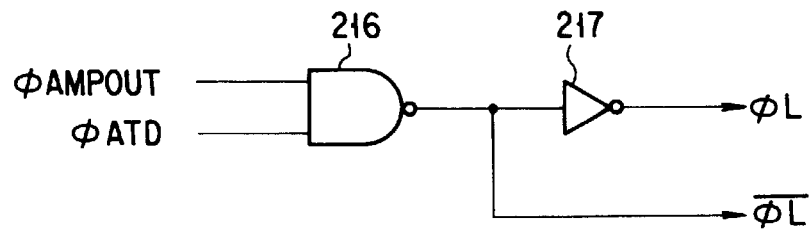
FIG. 10 is a circuit diagram showing an example of the construction of a signal creating circuit in the circuit of FIG. 8.

FIG. 8 shows an address counter for counting the number of changes of input addresses after coincidence of the input address and the access inhibition address when the coincidence of the input address with the access inhibition address is detected in the circuit of FIGS. 3 to 5, and it corresponds to the address counter 14 in the circuit of FIG. 1. FIG. 9 shows an example of the construction of a latch circuit in the circuit of FIG. 8, and FIG. 10 shows an example of the construction of a signal creating circuit. FIG. 11 shows an example of the construction of an address transition detector in the circuit of FIG. 8, and FIG. 12 shows an example of the construction of a counter section.

The inhibition address detection signal $\phi_{AMPOUT}$ output from the AND gate 140 shown in FIG. 3 is supplied to a latch circuit 200 and signal creating circuit 215. The latching operation of the latch circuit 200 is controlled by signals $\phi_L$, $\overline{\phi_L}$ output from the signal creating circuit 215. The signal creating circuit 215 is supplied with a signal $\phi_{ATD}$ indicating the transition of an address output from an inverter 220 to create the control signals $\phi_L$, $\overline{\phi_L}$ for controlling the latch circuit 200 and the other circuit. The input terminal of the inverter 220 is connected to a common bus line 230. The current path of a pull-up P-channel load MOS transistor 240 is connected between the common bus line 20 and the power supply $V_{DD}$ and the gate of the MOS transistor is connected to the ground node Vss. Further, N-channel MOS transistors 250,—corresponding in number to the bit number of an input address are connected in parallel between the common bus line 20 and the ground node Vss. Address transition detectors 260,—for respectively detecting variations in the address bits a0, a1, - - -, an are connected to the gates of the MOS transistors 250. Output signals a0atd, a1atd, - - -, anatd of the respective address transition detectors 260 are supplied to control the ON/OFF states of the MOS transistors 250, and when at least one of the output signals of the address transition detectors is set to the "H" level, the output signal $\phi_{ATD}$ of the inverter 220 is set to the "H" level. A transfer gate 280-1 having the current paths of P- and N-channel MOS transistors connected in parallel is connected between the output terminal of the inverter 220 and the clock input terminal of a counter section 270-0. Further, a transfer gate 280-2 having the current paths of P- and N-channel MOS transistors connected in parallel is connected between the clock input terminal of the counter section 270-0 and the power supply $V_{DD}$. An output signal AMP0UT of the latch circuit 200 is supplied to the gate of the N-channel MOS transistor of the transfer gate 280-1 and the gate of the P-channel MOS transistor of the transfer gate 280-2. Also, an output signal $\overline{AMP0UT}$ of the latch circuit 200 is supplied to the gate of the P-channel MOS transistor of the transfer gate 280-1 and the gate of the N-channel MOS transistor of the transfer gate 280-2. An output signal c0 of the counter section 270-0 is supplied to the clock input terminal of a next-stage counter section 270-1, and an output signal of the counter section 270-1 is supplied to the next-stage clock input terminal. An output signal cm is output from the output terminal of a final-stage counter section 270-m. The number of stages of the counter sections, that is, the value of m is determined according to the specification specifying the maximum amount of variation in the address from the access of the inhibition address which may cause the address scramble to be started.

As shown in FIG. 9, the latch circuit 200 includes P-channel MOS transistors 201 to 204, N-channel MOS transistors 205 to 208, inverters 209, 210 and resistor 211. The current paths of the MOS transistors 201, 202, 205, 206 are serially connected between the power supply $V_{DD}$ and the ground node Vss. The gate of the MOS transistor 201 is supplied with a signal $\overline{\phi_L}$, the gates of the MOS transistors 202, 205 are supplied with an inhibition address detection signal $\phi_{AMPOUT}$, and the gate of the MOS transistor 206 is supplied with a signal $\phi_L$, and the ON/OFF states of the respective MOS transistors are controlled. The input terminal of the inverter 209 is connected to a node of the current paths of the MOS transistors 202 and 205 and the output terminal thereof is connected to the input terminal of the inverter 210. The resistor 211 is connected between the output terminal of the inverter 209 and the ground node Vss. The resistor 211 is used to initialize the latch circuit at the time of turn-ON of the power supply and has a high resistance of the order of mega-ohm or giga-ohm. The current paths of the MOS transistors 203, 204, 207, 208 are serially connected between the power supply $V_{DD}$ and the ground node Vss. The gate of the MOS transistor 203 is supplied with the signal $\phi_L$, and the gate of the MOS transistor 208 is supplied with the signal $\overline{\phi_L}$, and the ON/OFF states thereof are controlled. The gates of the MOS transistors 204, 207 are connected to the output terminal of the inverter 209. A connection node of the current paths of the MOS transistors 204, 207 is connected to the input terminal of the inverter 209. A signal $\overline{AMP0UT}$ is output from the output terminal of the inverter 210 and a signal AMP0UT is output from the inverter 209.

FIG. 10 shows an example of the construction of the signal creating circuit 215 in the circuit of FIG. 8. The circuit 215 includes a NAND gate 216 and an inverter 217. The NAND gate 216 is supplied with a signal $\phi_{AMPOUT}$ at one input terminal and a signal $\phi_{ATD}$ at the other input terminal. An output signal of the NAND gate 216 is supplied to the inverter 217. A signal $\phi_L$ is output from the output terminal of the inverter 217 and a signal $\overline{\phi_L}$ is output from the output terminal of the NAND gate 216.

FIG. 11 shows an example of the construction of the address transition detector 260 in the circuit of FIG. 8. In this case, the construction of the address transition detector for detecting a variation in the address a0 is shown as a representative example, but the other address transition detectors of the addresses a1, - - -, an have the same construction. The address transition detector 260 includes inverters 281 to 284, resistors 286 to 288, capacitors 289 to 291, P-channel MOS transistors 292 to 295, and N-channel MOS transistors 296 to 299. The resistors 286 to 288 and the capacitors 289 to 291 construct a delay circuit and a period in which a rectangular signal a0atd output is set at the "H", level is determined by the CR constant of the resistors 286 to 288 and the capacitors 289 to 291. The MOS transistors 292 to 299 construct an exclusive-NOR gate and the output signal thereof is set at the "H" level in a period in which the input signal $\phi_{AMP}$ and a signal delayed by the above delay circuit coincide with each other.

FIG. 12 shows an example of the construction of the counter section 270-0 in the circuit of FIG. 8. The counter section includes inverters 300 to 307, P-channel MOS transistors 308 to 319, and N-channel MOS transistors 320 to 331. The input terminal of the inverter 300 is connected to the transfer gates 280-1, 280-2 and supplied with a signal I1, and the output terminal thereof is connected to the input terminal of the inverter 301. The current paths of the MOS transistors 320 and 308, the current paths of the MOS transistors 309 and 321, the current paths of the MOS transistors 310 and 322, and the current paths of the MOS transistors 323 and 311 are connected in parallel with each other, and the parallel-connected current paths of the MOS transistors are serially connected. The gates of the MOS transistors 308, 321, 322 and 311 are connected to the output terminal of the inverter 300, and the gates of the MOS transistors 320, 309, 310 and 323 are connected to the output terminal of the inverter 301. The input terminal of the inverter 302 is connected to a connection node of the current paths of the MOS transistors 323 and 311, and the output terminal thereof is connected to a connection node of the current paths of the MOS transistors 320 and 308. The input terminal of the inverter 303 is connected to the output terminal of the inverter 302 and an output signal c0 is output from the output terminal thereof.

The current paths of the MOS transistors 312, 313, 324, 325 are serially connected between the power supply $V_{DD}$ and the ground node Vss. The current paths of the MOS transistors 316, 317, 328, 329 are serially connected between the power supply $V_{DD}$ and the ground node Vss. The current paths of the MOS transistors 318, 319, 330, 331 are serially connected between the power supply $V_{DD}$ and the ground node Vss. The input terminal of the inverter 304 is supplied with a signal $\overline{AMP0UT}$ (acting as a reset signal) and the output terminal thereof is connected to the gates of the MOS transistors 312, 316, 327, 331. The input terminal of the inverter 305 is connected to a connection node of the current paths of the MOS transistors 320, 308, 309, 321, and the output terminal thereof is connected to the gates of the MOS transistors 313, 324. The input terminal of the inverter 306 is connected to a connection node of the current paths of the MOS transistors 310, 322, 323, 311, and the output terminal thereof is connected to the gates of the MOS transistors 317, 328. The input terminal of the inverter 307 is connected to the output terminal of the inverter 304 and the output terminal thereof is connected to the gates of the MOS transistors 325, 314, 329, 318. The gates of the MOS transistors 315, 326, 319, 330 are connected to the ground node Vss. With this connection, the initial value of the counter section 270-0 is set to "1". Further, a connection node of the current paths of the MOS transistors 317, 328 and a connection node of the current paths of the MOS transistors 319, 330 are connected to the input terminal of the inverter 302.

Figure 13:
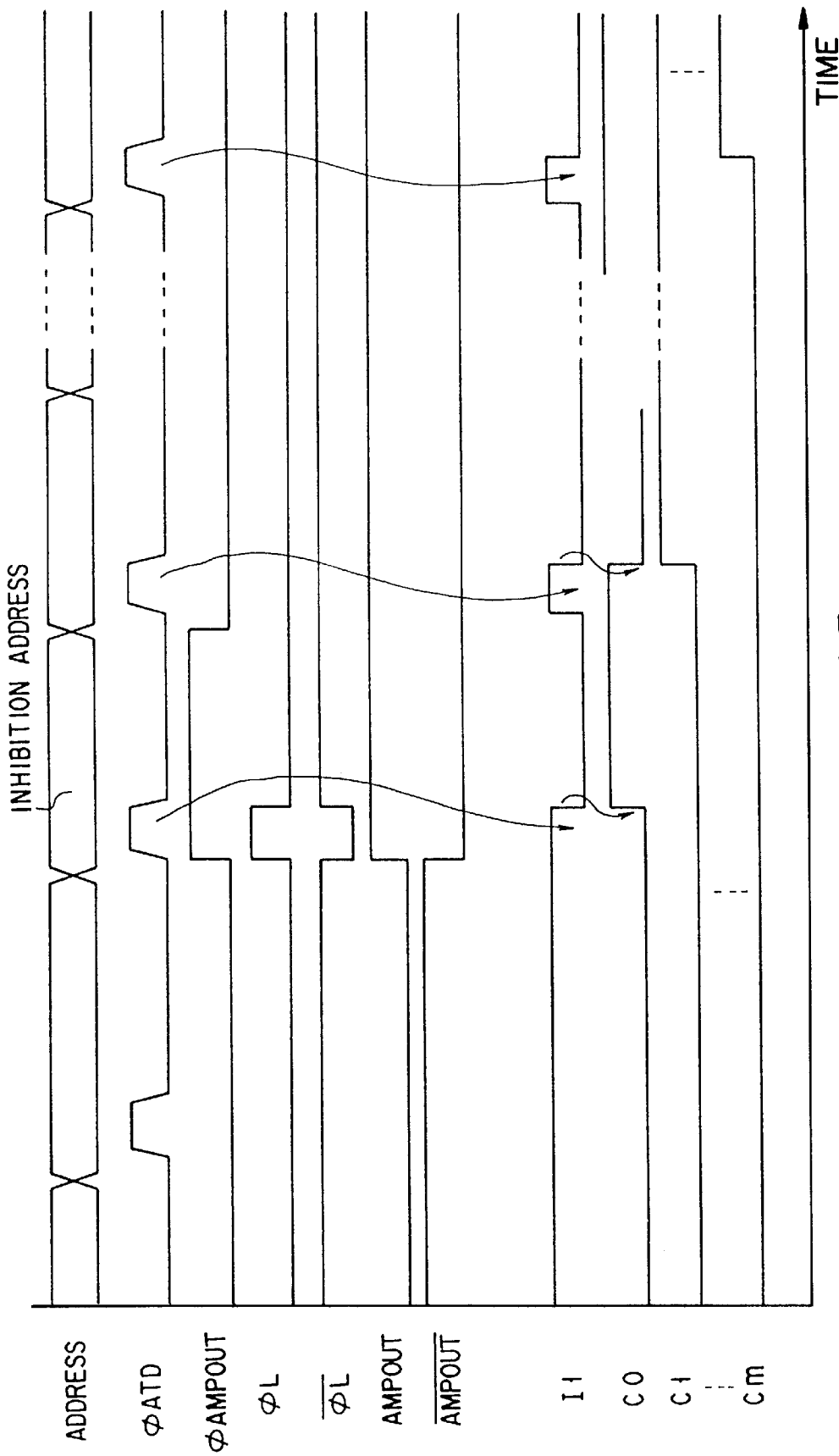
FIG. 13 is a timing chart showing the operation of the circuit shown in FIGS. 8 to 12.

As shown by the timing chart of FIG. 13, the output signal $\phi_{ATD}$ of the inverter 220 is set to and kept at the "H" level for a preset period of time each time a variation in the address is detected by the address transition detection circuit 260. At this time, if the inhibition address detection signal $\phi_{AMP0UT}$ is set at the "L" level, the output signals AMP0UT and $\overline{AMP0UT}$ of the latch circuit 200 are respectively set to the "L" level and "H" level. Since the signal $\overline{AMP0UT}$ of "H" level is supplied to the reset terminals of the counter sections 270-0, 270-1, - - - , 270-m, the counter sections are set into the reset state. Further, the transfer gate 280-1 is set in the OFF state, the transfer gate 280-2 is set in the ON state, and a signal of "H" level is supplied to the clock input terminal of the counter section 270-0.

On the other hand, if the inhibition address detection signal $\phi_{AMP0UT}$ is set to the "H" level and a variation in the address is detected by the address transition detection circuit 260, the signal $\phi_L$ output from the signal creating circuit 215 is set at the "H" level for a preset period of time, the signal $\overline{\phi_L}$ is set at the "L" level for a preset period of time, and the latch circuit 200 is released, thereafter the signal $\phi_{AMP0UT}$ is latched by the latch circuit 200. As a result, the signals $\overline{AMP0UT}$ and AMP0UT are respectively set to the "H" level and "L" level. As a result, the transfer gate 280-2 is set in the OFF state, the transfer gate 280-1 is set in the ON state, and the signal $\phi_{ATD}$ output from the inverter 220 is supplied to the counter sections 270-0, 270-1, - - - , 270-m so as to permit the number of inputs of addresses after the coincidence of the input address and the inhibition address to be counted.

Figure 15:
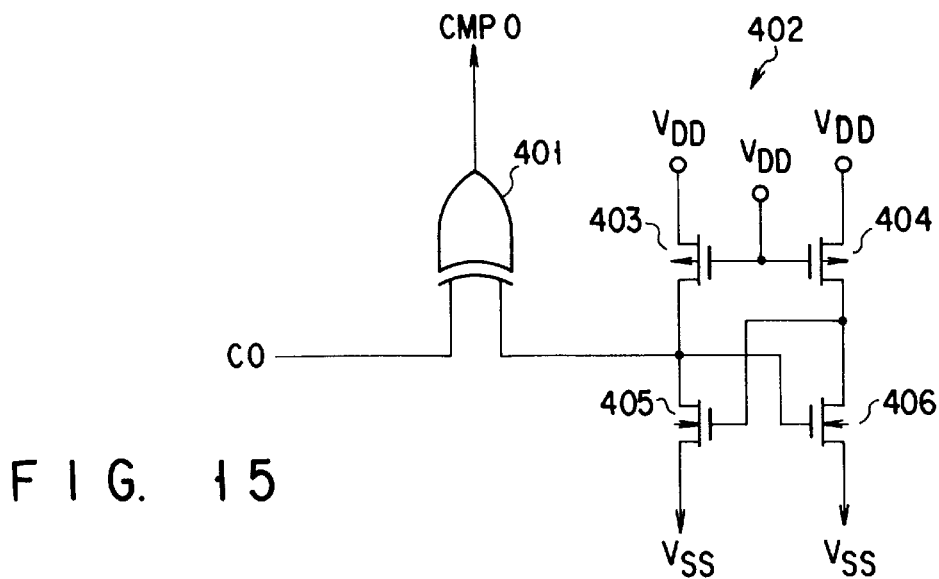
FIG. 15 is a circuit diagram showing an example of the construction of a count number comparing section in the circuit of FIG. 14.
Figure 16:
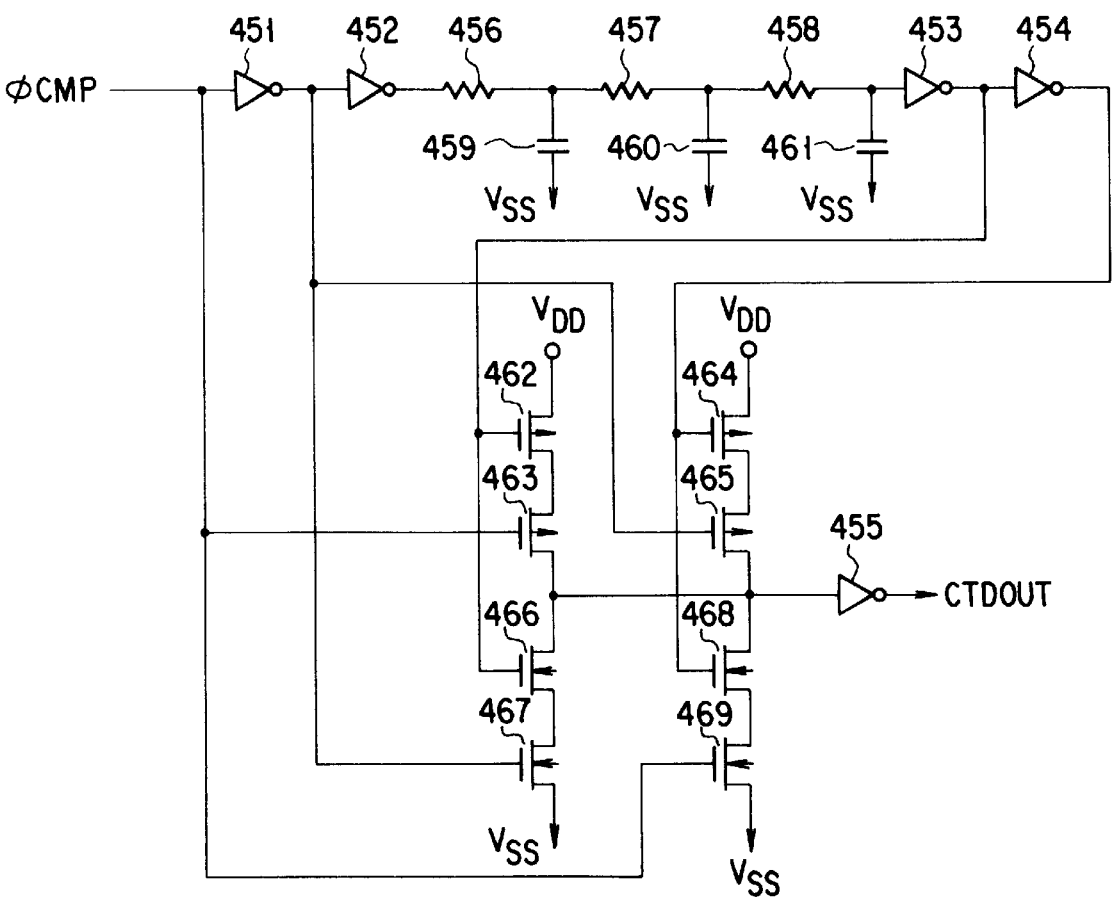
FIG. 16 is a circuit diagram showing an example of the construction of a count number transition detector in the circuit of FIG. 14.

FIG. 14 shows a circuit for comparing the number of changes of addresses counted by the address counter shown in FIGS. 8 to 12 with the previously stored count number to check whether it has reached a preset count number or not and the circuit corresponds to the comparator 15 and register circuit 16 shown in FIG. 1. FIG. 15 shows an example of the construction of a count number comparing section in the circuit of FIG. 14, and FIG. 16 shows an example of the construction of a count transition detector. Further, FIG. 17 shows an example of the construction of a latch circuit for latching an output signal of the circuit of FIG. 14.

As shown in FIG. 14, count numbers c0, c1, - - - , cm are supplied to respective count number comparing sections 400-0, 400-1, - - - , 400-m for respective bits and compared with previously stored count numbers for each bit. Comparison outputs CMP0, CMP1, - - - , CMPm of the count number comparing sections 400-0, 400-1, - - - , 400-m are supplied to NAND gates 410, - - - , 410 for every preset number of bits. Output signals of the NAND gates 410, - - - , 410 are supplied to a NOR gate 420. With this construction, if the input count numbers c0, c1, - - - , cm coincide with the count numbers counted by the counter sections 270-0, 270-1, - - - , 270-m of FIG. 8 for all of the bits, a signal $\phi_{CMP}$ of "H" level is output from the NOR gate 420. The signal $\phi_{CMP}$ is supplied to one input terminal of a NAND gate 440 via delay inverters 430, 431 and to the input terminal of a count transition detector 450. The count transition detector 450 detects a variation in the signal $\phi_{CMP}$ output from the NOR gate 420, creates and outputs a rectangular pulse signal CTDOUT with a preset width to the other input terminal of the AND gate 440.

As shown in FIG. 15, the count number comparing section 400-0 includes an exclusive-OR gate 401 and a latch circuit 402. The exclusive-OR gate 401 is supplied with count information corresponding to the count number at one input terminal thereof and with an output of the latch circuit 402 at the other input terminal. The latch circuit 402 includes P-channel MOS transistors 403, 404 and N-channel MOS transistors 405, 406. The sources and gates of the MOS transistors 403, 404 are connected to the power supply $V_{DD}$. The drain of the MOS transistor 405 is connected to the drain of the MOS transistor 403 and the other input terminal of the exclusive-OR gate 401, the source thereof is connected to the ground node Vss, and the gate thereof is connected to the drain of the MOS transistor 404. The drain of the MOS transistor 406 is connected to the drain of the MOS transistor 404, the source thereof is connected to the ground node Vss, and the gate thereof is connected to the drain of the MOS transistor 403 and the other input terminal of the exclusive-OR gate 401. Impurity such as boron is ion-implanted into the channel region of one of the P-channel MOS transistors 403, 404 according to the count number so as to form a depletion type. For example, when count information is "1" level, the MOS transistor 403 is made to a depletion type, and when the count information is "0" level, the MOS transistor 404 is made to a depletion type. As a result, a signal of "1" level or "0" level corresponding to the count information is supplied to the other input terminal of the exclusive-OR gate 401 and is compared with the count information c0 which is supplied to the one input terminal thereof to check the coincidence thereof. A signal CMP0 output from the exclusive-OR gate 401 is supplied to the NAND gate 410.

The other count number comparing sections 400-1, - - - , 400-m also have the same construction as the count number comparing section 400-0. When all of the bits of the count information become coincident, the output of the NAND gate 410 is set to the "L" level and the output signal (coincidence detection signal) $\phi_{CMP}$ of the NOR gate 420 is raised to the "H" level. As a result, coincidence of the input count information c0, c1, - - - , cm and the previously stored count information, that is, coincidence of the count numbers can be detected.

FIG. 16 shows an example of the construction of the count transition detector 450 in the circuit of FIG. 14. The count transition detector 450 includes inverters 451 to 455, resistors 456 to 458, capacitors 459 to 461, P-channel MOS transistors 462 to 465, and N-channel MOS transistors 466 to 469. The resistors 456 to 458 and the capacitors 459 to 461 construct a delay circuit and a period in which a rectangular pulse signal TDOUT output from the inverter 455 is set at the "H" level is determined by the CR constant of the resistors 456 to 458 and the capacitors 459 to 461. The MOS transistors 462 to 469 and the inverter 455 construct an exclusive-OR gate and the output signal thereof is set at the "H" level in a period in which the coincidence detection signal $\phi_{CMP}$ supplied to the input terminal of the inverter 451 and a signal delayed by the above delay circuit coincide with each other.

The transition detector 450 functions to temporarily make the coincidence detection signal $\phi_{CMP}$ output from the NOR gate 420 invalid. That is, when a skew occurs, it prevents the security circuit from being erroneously operated.

FIG. 17 shows a latch circuit for latching an output of the circuit of FIG. 14. The latch circuit includes P-channel MOS transistors 470 to 473, N-channel MOS transistors 474 to 477, inverters 478, 479, and resistor 480. The current paths of the MOS transistors 470, 471, 474, 475 are serially connected between the power supply $V_{DD}$ and ground node Vss. The gate of the MOS transistor 470 is supplied with a signal $\overline{\phi_L}$, the gates of the MOS transistors 471, 474 are supplied with the output signal $\phi_{CMPOUT}$ of the AND gate 440 in the circuit of FIG. 14, the gate of the MOS transistor 475 is supplied with a signal $\phi_L$, and the ON/OFF states thereof are controlled. The input terminal of the inverter 478 is connected to a connection node of the current paths of the MOS transistors 471 and 474 and the output terminal thereof is connected to the input terminal of the inverter 479. The resistor 480 is connected between the output terminal of the inverter 478 and the ground node Vss. The resistor 480 is used to initialize the latch circuit at the time of turn-ON of the power supply and has a high resistance of the order of mega-ohm or giga-ohm. The current paths of the MOS transistors 472, 473, 476, 477 are serially connected between the power supply $V_{DD}$ and the ground node Vss. The gate of the MOS transistor 472 is supplied with the signal $\phi_L$, and the gate of the MOS transistor 477 is supplied with the signal $\overline{\phi L}$, and the ON/OFF states thereof are controlled. The gates of the MOS transistors 473, 476 are connected to the output terminal of the inverter 478. A connection node of the current paths of the MOS transistors 473 and 476 is connected to the input terminal of the inverter 478. A signal $\overline{CMP0UT}$ is output from the output terminal of the inverter 479 and a signal CMP0UT is output from the output terminal of the inverter 478.

Figure 18:
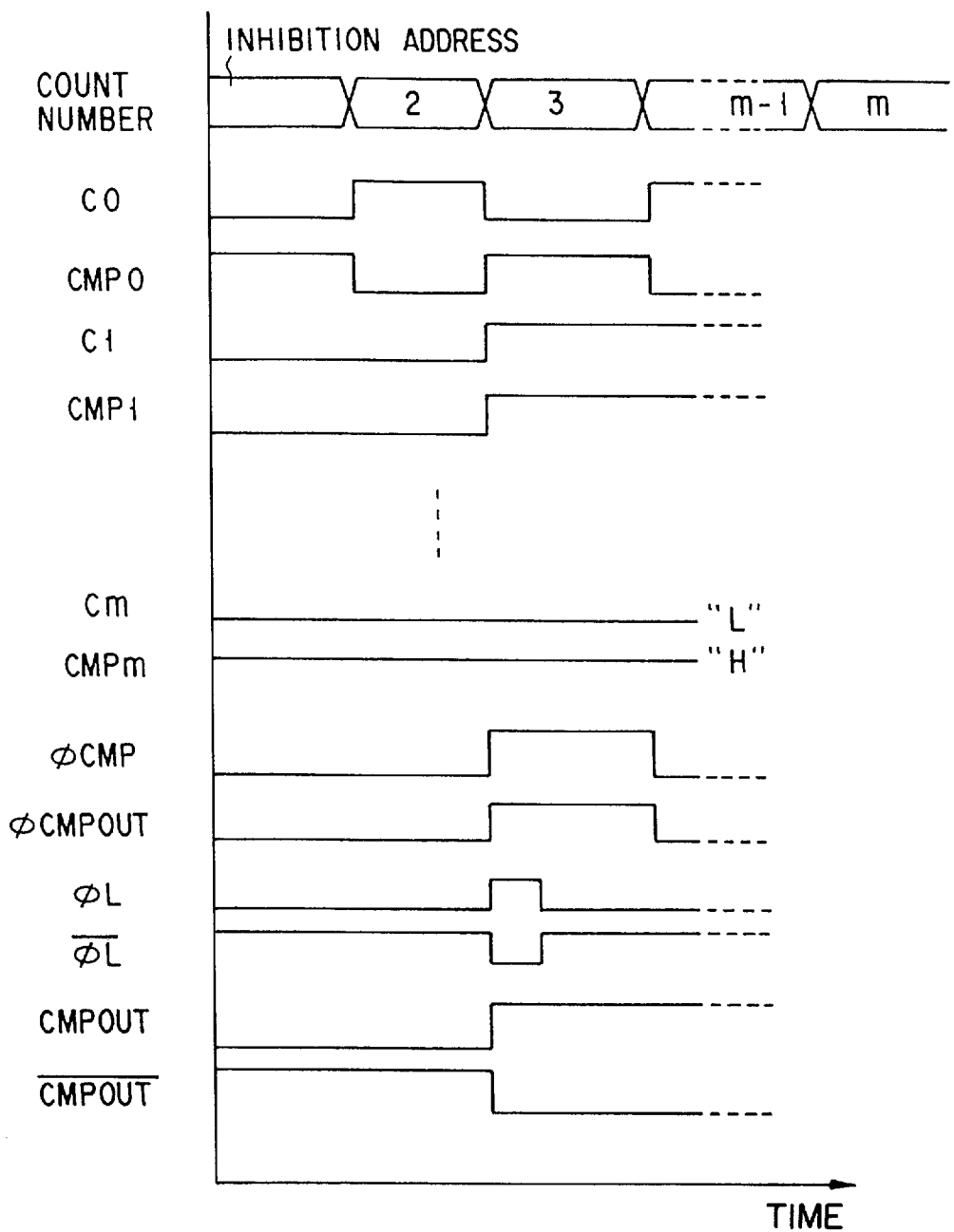
FIG. 18 is a timing chart for illustrating the operation of the circuit shown in FIGS. 14 to 17.

FIG. 18 is a timing chart for illustrating the operation of the circuit shown in FIGS. 14 to 17. When the inhibition address is accessed and the counter sections 270-0, 270-1, - - - , 270-m start the counting operation, count information c0, c1, - - - , cm corresponding to the count number and the previously stored count information are compared for each bit in the count number comparing sections 400-0, 400-1, - - - , 400-m. If the output signals CMP0, CMP1, - - - , CMPm of the count number comparing sections 400-0, 400-1, - - - , 400-m become coincident and it is detected that the count number has reached the previously stored count number, output signals of the NAND gates 410, - - - , 410 are set to the "L" level and the output signal $\phi_{CMP}$ of the NOR gate 420 is set to the "H" level. A case wherein m is set to 3, that is, the scramble operation is started when a variation of three addresses from the access of the inhibition address is detected is shown in FIG. 18.

A count number coincidence signal $\phi_{CMPOUT}$ is output from the AND gate 440 in response to the "H" level of the output signal $\phi_{CMP}$ of the NOR gate 420. The signal is latched by the latch circuit shown in FIG. 17, and the signals CMP0UT and $\overline{CMP0UT}$ are respectively set to the "H" level and "L" level.

Figure 19:
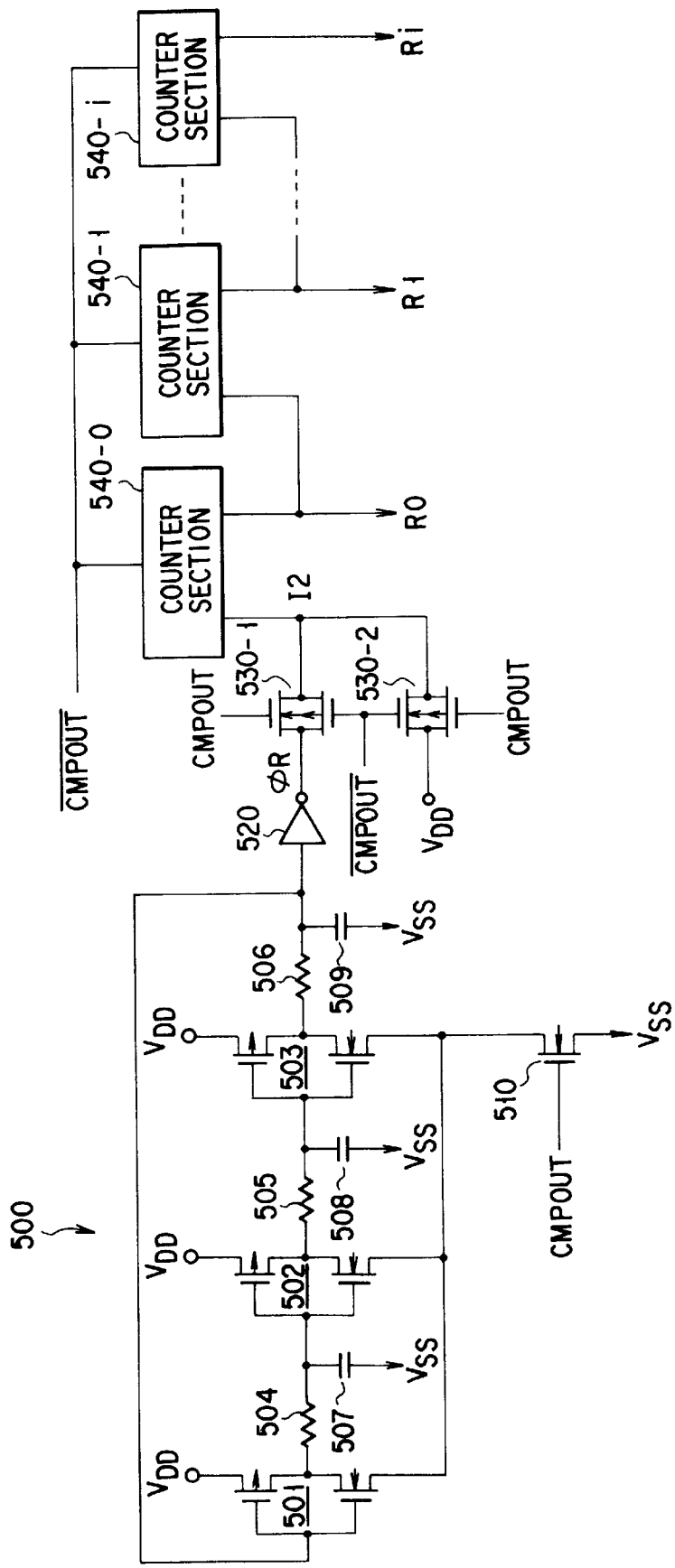
FIG. 19 is a circuit diagram showing an example of the construction of a ring oscillator and a counter for counting the output of the ring oscillator.

FIG. 19 shows an example of the construction of a ring oscillator and a counter for counting the cycle of the ring oscillator and the ring oscillator and counter correspond to the ring oscillator and counter 17 in the circuit of FIG. 1. The ring oscillator 500 includes CMOS inverters 501, 502, 503, resistors 504 to 506, capacitors 507 to 509, and oscillating operation controlling MOS transistor 510. A CR time constant circuit constructed by the resistor 504 and the capacitor 507 is connected between the output terminal of the inverter 501 and the input terminal of the inverter 502. A CR time constant circuit constructed by the resistor 505 and the capacitor 508 is connected between the output terminal of the inverter 502 and the input terminal of the inverter 503. Further, a CR time constant circuit constructed by the resistor 506 and the capacitor 509 is connected between the output terminal of the inverter 503 and the input terminal of the inverter 501. The current path of the MOS transistor 510 is connected between the sources of the N-channel MOS transistors in the inverters 501 to 503 and the ground node Vss, the gate thereof is supplied with the signal CMP0UT output from the latch circuit shown in FIG. 17 and the ON/OFF state thereof is controlled.

A connection node of the resistor 506 and the capacitor 509 is connected to the inverter 520. A transfer gate 530-1 having the current paths of P- and N-channel MOS transistors connected in parallel is connected between the output terminal of the inverter 520 and the clock input terminal of the counter section 540-0. A transfer gate 530-2 having the current paths of P- and N-channel MOS transistors connected in parallel is connected between the clock input terminal of the counter section 540-0 and the power supply $V_{DD}$. The gate of the N-channel MOS transistor of the transfer gate 530-1 and the gate of the P-channel MOS transistor of the transfer gate 530-2 are supplied with the signal CMP0UT output from the latch circuit, and the gate of the P-channel MOS transistor of the transfer gate 530-1 and the gate of the N-channel MOS transistor of the transfer gate 530-2 are supplied with the signal $\overline{CMP0UT}$. An output signal R0 of the counter section 540-0 is supplied to the clock input terminal of the next-stage counter section 540-1, and an output signal of the counter section 540-1 is supplied to the clock input terminal of the next stage. Then, an output signal Ri is output from the output terminal of the counter section 540-i of the final stage.

Figure 20:
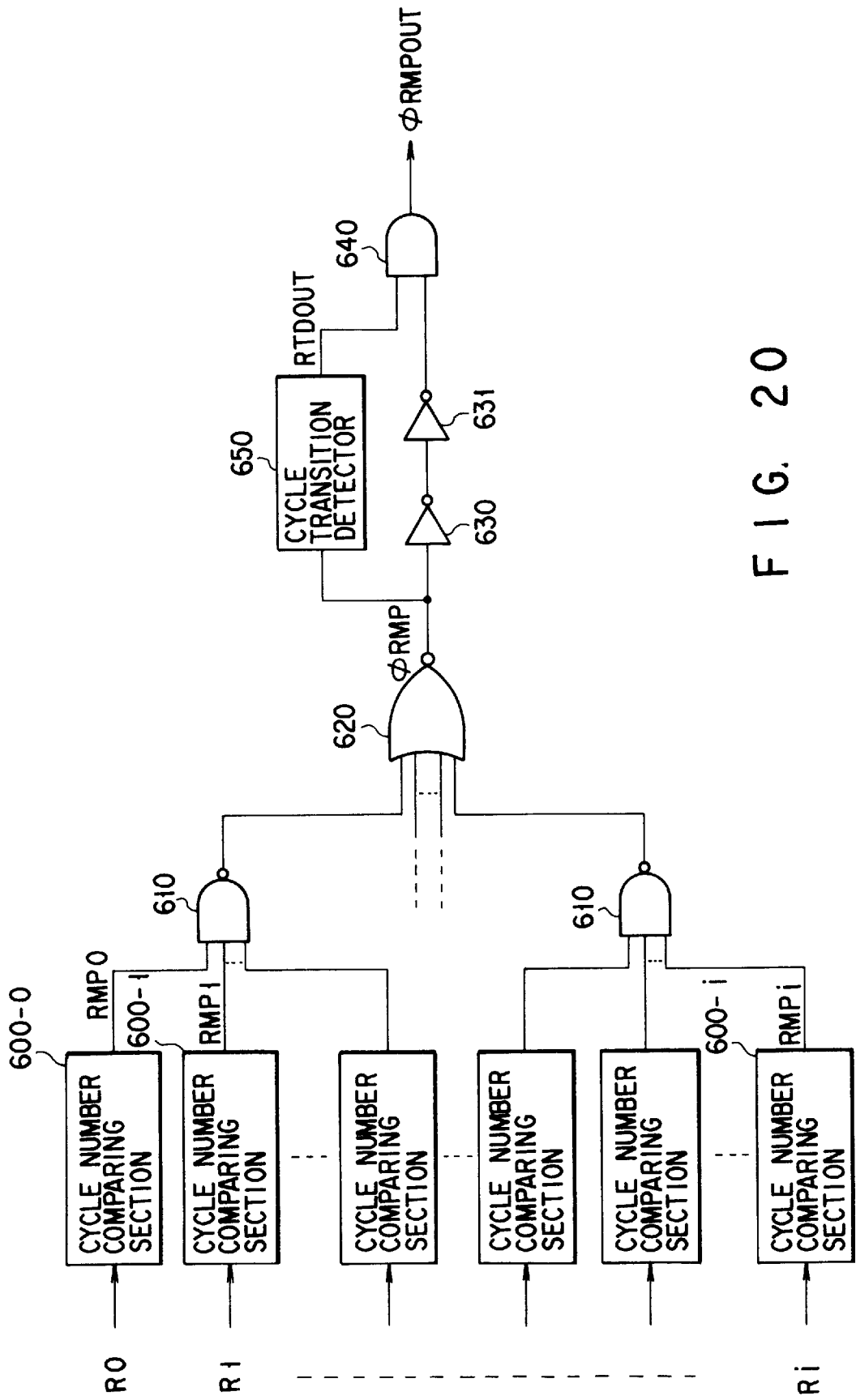
FIG. 20 is a circuit diagram showing a comparing circuit for comparing the cycle number of the ring oscillator counted by the counter of FIG. 19 with a previously stored cycle number to check whether or not a preset count number is reached.

FIG. 20 shows a comparing circuit for comparing the cycle number of the ring oscillator counted by the counter of FIG. 19 with a previously stored cycle number to check whether or not a preset count number is reached and the comparing circuit corresponds to the comparator 18 and the register circuit 19 in the circuit of FIG. 1. FIG. 21 shows an example of the construction of a cycle number comparing section in the circuit of FIG. 20, FIG. 22 shows an example of the construction of a cycle transition detector, and FIG. 23 shows an example of the construction of a latch circuit for latching an output signal of the circuit of FIG. 20.

As shown in FIG. 20, cycle numbers R0, R1, - - - , Ri are supplied to cycle number comparing sections 600-0, 600-1, - - - , 600-i for each bit and compared with previously stored cycle numbers for respective bits. Comparison results RMP0, RMP1, - - - , RMPi of the cycle comparing sections 600-0, 600-1, - - - , 600-i are supplied to NAND gates 610, - - - , 610 for every preset number of bits. Output signals of the NAND gates 610, - - - , 610 are supplied to a NOR gate 620. With this construction, if the input cycle numbers R0, R1, - - - , Ri respectively coincide with the cycle numbers in all of the bits, a signal $\phi_{RMP}$ of "H" level is output from the NOR gate 620. The signal $\phi_{RMP}$ is supplied to one input terminal of a AND gate 640 via inverters 630, 631 for delay and to the input terminal of a cycle transition detector 650. The transition detector 650 detects a variation in the signal $\phi_{RMP}$ output from the NOR gate 620 to create a rectangular pulse signal TDOUT with a preset width and supply the same to the other input terminal of the AND gate 640.

The cycle comparing section 600-0 has an exclusive-OR gate 601 and a latch circuit 602 as shown in FIG. 21. Cycle information R0 corresponding to the cycle number is supplied to one input terminal of the exclusive-OR gate 601 and an output of the latch circuit 602 is supplied to the other input terminal thereof. The latch circuit 602 includes P-channel MOS transistors 603, 604 and N-channel MOS transistors 605, 606. The sources and gates of the MOS transistors 603, 604 are connected to a power supply $V_{DD}$. The drain of the MOS transistor 605 is connected to the drain of the MOS transistor 603 and the other input terminal of the exclusive-OR gate 601, the source thereof is connected to a ground node Vss, and the gate thereof is connected to the drain of the MOS transistor 604. The drain of the MOS transistor 606 is connected to the drain of the MOS transistor 604, the source thereof is connected to the ground node Vss, and the gate thereof is connected to the drain of the MOS transistor 603 and the other input terminal of the exclusive-OR gate 601. Impurity such as boron is ion-implanted into the channel region of one of the P-channel MOS transistors 603, 604 according to the cycle number so as to form a depletion type. For example, when the cycle information is "1" level, the MOS transistor 603 is made to a depletion type, and when the cycle information is "0" level, the MOS transistor 604 is made to a depletion type. As a result, a signal of "1" level or "0" level corresponding to the cycle information is supplied to the other input terminal of the exclusive-OR gate 601 and is compared with the cycle number R0 which is supplied to the one input terminal thereof to check the coincidence thereof. A signal RMP0 output from the exclusive-OR gate 601 is supplied to the NAND gate 610.

The other cycle number comparing sections 600-1, - - - , 600-i also have the same construction as the cycle number comparing section 600-0. If all of the bits of the cycle information coincide, outputs of the NAND gates 610, - - - , 610 are set to the "L" level and the output signal (coincidence detection signal) $\phi_{RMP}$ of the NOR gate 620 is raised to the "H", level. As a result, the coincidence of the input cycle information R0, R1, - - - , Ri and the previously stored cycle information, that is, coincidence of the cycle numbers can be detected.

FIG. 22 shows an example of the construction of the cycle transition detector 650 in FIG. 20. The transition detector 650 includes inverters 651 to 655, resistors 656 to 658, capacitors 659 to 661, P-channel MOS transistors 662 to 665, and N-channel MOS transistors 666 to 669. The resistors 656 to 658 and the capacitors 659 to 661 construct a delay circuit and a period in which an output rectangular pulse signal RTDOUT is set at the "H" level is determined by the CR constant of the resistors 656 to 658 and the capacitors 659 to 661. The MOS transistors 662 to 669 and the inverter 655 construct an exclusive-OR gate and the output signal thereof is set at the "H" level in a period in which the input signal $\phi_{RMP}$ and a signal delayed by the above delay circuit coincide with each other.

The transition detector 650 functions to temporarily make the coincidence detection signal $\phi_{RMP}$ output from the NOR gate 620 invalid. That is, when a skew occurs, it prevents the security circuit from being erroneously operated.

FIG. 23 shows a latch circuit for latching an output of the circuit of FIG. 20. The latch circuit includes P-channel MOS transistors 670 to 673, N-channel MOS transistors 674 to 677, inverters 678, 679, and resistor 680. The current paths of the MOS transistors 670, 671, 674, 675 are serially connected between the power supply $V_{DD}$ and ground node Vss. The gate of the MOS transistor 670 is supplied with a signal $\overline{\phi L}$, the gates of the MOS transistors 671, 674 are supplied with the output signal 0 CMP0UT of the AND gate 640 in the circuit of FIG. 20, the gate of the MOS transistor 675 is supplied with a signal $\phi_L$, and the ON/OFF states thereof are controlled. The input terminal of the inverter 678 is connected to a connection node of the current paths of the MOS transistors 671 and 674 and the output terminal thereof is connected to the input terminal of the inverter 679. The resistor 680 is connected between the output terminal of the inverter 678 and the ground node Vss. The resistor 680 is used to initialize the latch circuit at the time of turn-ON of the power supply and has a high resistance of the order of mega-ohm or giga-ohm. The current paths of the MOS transistors 672, 673, 676, 677 are serially connected between the power supply $V_{DD}$ and the ground node Vss. The gate of the MOS transistor 672 is supplied with the signal $\phi_L$, and the gate of the MOS transistor 677 is supplied with the signal $\overline{\phi_L}$, and the ON/OFF states thereof are controlled. The gates of the MOS transistors 673, 676 are connected to the output terminal of the inverter 678. A connection node of the current paths of the MOS transistors 673 and 676 is connected to the input terminal of the inverter 678. A signal $\overline{RMP0UT}$ is output from the output terminal of the inverter 679 and a signal RMP0UT is output from the output terminal of the inverter 678.

FIG. 24 is a timing chart for illustrating the operation of the circuit shown in FIGS. 19 to 23. When the output signal CMP0UT of the latch circuit shown in FIG. 17 is set to the "H" level, the MOS transistor 510 is turned ON to start the oscillation operation of the ring oscillator 500. As a result, a clock signal $\phi_R$ is output from the inverter 520. When the output signals CMP0UT of the latch circuit shown in FIG. 17 are respectively set at the "H" level and "L" level, the transfer gates 530-1, 530-2 are respectively set in the ON state and OFF state, the clock signal $\phi_R$ output from the inverter 520 is supplied to the counter section 540-0, and the counting operations are started in the counter sections 540-0, 540-1, - - - , 540-i.

Output signals R0, R1, - - - , Ri of the counter sections 500-0, 500-1, - - - , 500-i are supplied to the cycle number comparing sections 600-0, 600-1, - - - , 600-i shown in FIG. 20 and compared with the previously stored cycle numbers. Then, if coincidence of the above cycle numbers is detected, a coincidence detection signal $\phi_{RMP0UT}$ is output from the AND gate 640.

FIG. 25 shows an example of the construction of a register circuit storing address scramble information and the register circuit corresponds to the register circuit 20 in the circuit of FIG. 1. The register circuit includes an exclusive-OR gate 701, inverter 708 and latch circuit 702. The exclusive-OR gate 701 is supplied with the signal RMPOUT or CMPOUT at one input terminal and an output signal of the latch circuit 702 at the other input terminal. The latch circuit 702 includes P-channel MOS transistors 703, 704 and N-channel MOS transistors 705, 706. The sources and gates of the MOS transistors 703, 704 are connected to the power supply VDD. The drain of the MOS transistor 705 is connected to the drain of the MOS transistor 703 and the other input terminal of the exclusive-OR gate 701, the source thereof is connected to the ground node Vss, and the gate thereof is connected to the drain of the MOS transistor 704. The drain of the MOS transistor 706 is connected to the drain of the MOS transistor 704, the source thereof is connected to the ground node Vss, and the gate thereof is connected to the drain of the MOS transistor 703 and the other input terminal of the exclusive-OR gate 701. Impurity such as boron is ion-implanted into the channel region of one of the P-channel MOS transistors 703, 704 according to the count number so as to form a depletion type. For example, when the scramble information is "1" level, the MOS transistor 703 is made to a depletion type, and when the scramble information is "0" level, the MOS transistor 704 is made to a depletion type. As a result, a signal of "1" level or "0" level corresponding to the scramble information is supplied to the other input terminal of the exclusive-OR gate 701 and is compared with the signal RMPOUT or CMPOUT which is supplied to the one input terminal thereof to check the coincidence thereof. Signals SCR0/1 to SCRn−1/n output from the exclusive-OR gates 701 provided for respective bits and signals $\overline{SCR0/1}$ to $\overline{SCRn-1/n}$ output from the inverters 707 are supplied to the scramble circuit.

FIG. 26 shows an example of the construction of the scramble circuit and the circuit corresponds to the switch circuit 21 of FIG. 1. The scramble circuit functions to supply the address output from the address buffer to the decoder after scrambling the address or without scrambling the same according to the output of the circuit shown in FIG. 25. In the circuit of FIG. 1, the first address bit and the last address bit are exchanged, but in this circuit, the address is output after exchanging the adjacent bits. In a portion for dealing with the address bits A0, A1, the scramble circuit includes inverter circuits 800, 801, 802, 803 and transfer gates 804 to 807. In the normal access operation, as shown by the timing chart of FIG. 27, the address bit A0 is supplied to the decoder via the inverter 800, transfer gate 804 and inverter 801 (address bit a0), and the address bit A1 is supplied to the decoder via the inverter 802, transfer gate 805 and inverter 803 (address bit a1). On the other hand, if the security circuit is operated, the address bit A0 is supplied to the decoder via the inverter 800, transfer gate 806 and inverter 803 (address bit a0), and the address bit A1 is supplied to the decoder via the inverter 802, transfer gate 807 and inverter 801 (address bit a1). The other bits are also processed in the same manner and the address is output after exchanging the adjacent bits.

Figure 28:
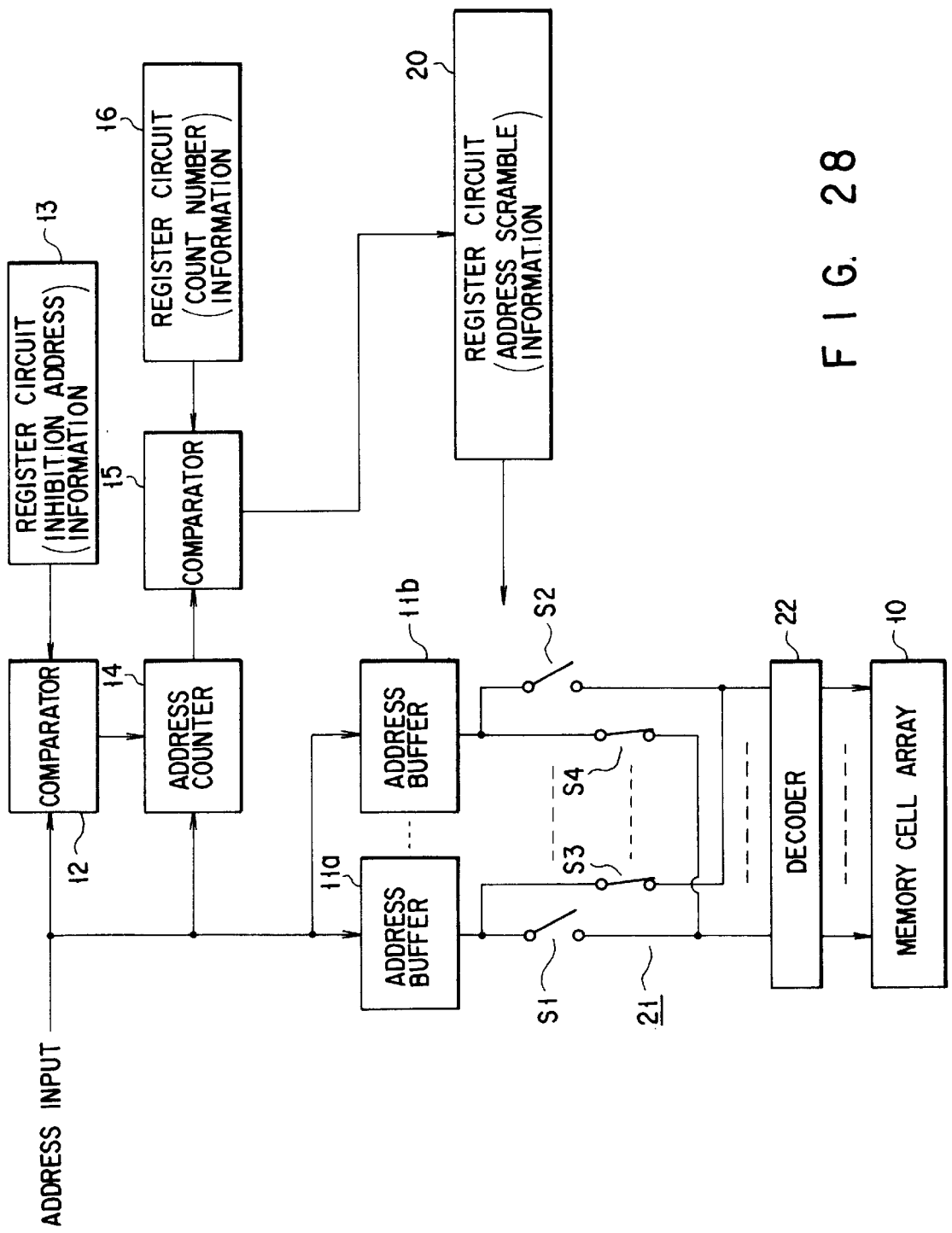

FIG. 28 shows an extracted circuit portion relating to the security function in the mask ROM, for illustrating a non-volatile semiconductor memory device according to a second embodiment of this invention. The circuit of FIG. 28 is obtained by omitting the ring oscillator and counter 17, comparator 18 and register circuit 19 in the circuit of FIG. 1 and causing the output of the comparator 15 to be supplied to the register circuit 20. The other construction is the same as that of the circuit shown in FIG. 1 and portions which are the same as those of FIG. 1 are denoted by the same reference numerals and the detail explanation therefor is omitted.

In the construction shown in FIG. 28, when a comparator 12 detects that the inhibition address is accessed, an address counter 14 is operated, and when the number of changes of addresses has reached a count number stored in a register circuit 16, address scramble information is read out from a register circuit 20 to scramble the address.

With the above construction, it is not easy to specify the inhibition address and a sufficiently high security function can be attained. The circuit shown in the second embodiment is somewhat lower in the security function than the circuit shown in the first embodiment, but the circuit scale can be made small, and the degree of the security function may be selectively set according to the desired protection effect.

This invention is not limited to the above first and second embodiments and can be variously modified without departing from the technical scope thereof.

Figure 29:
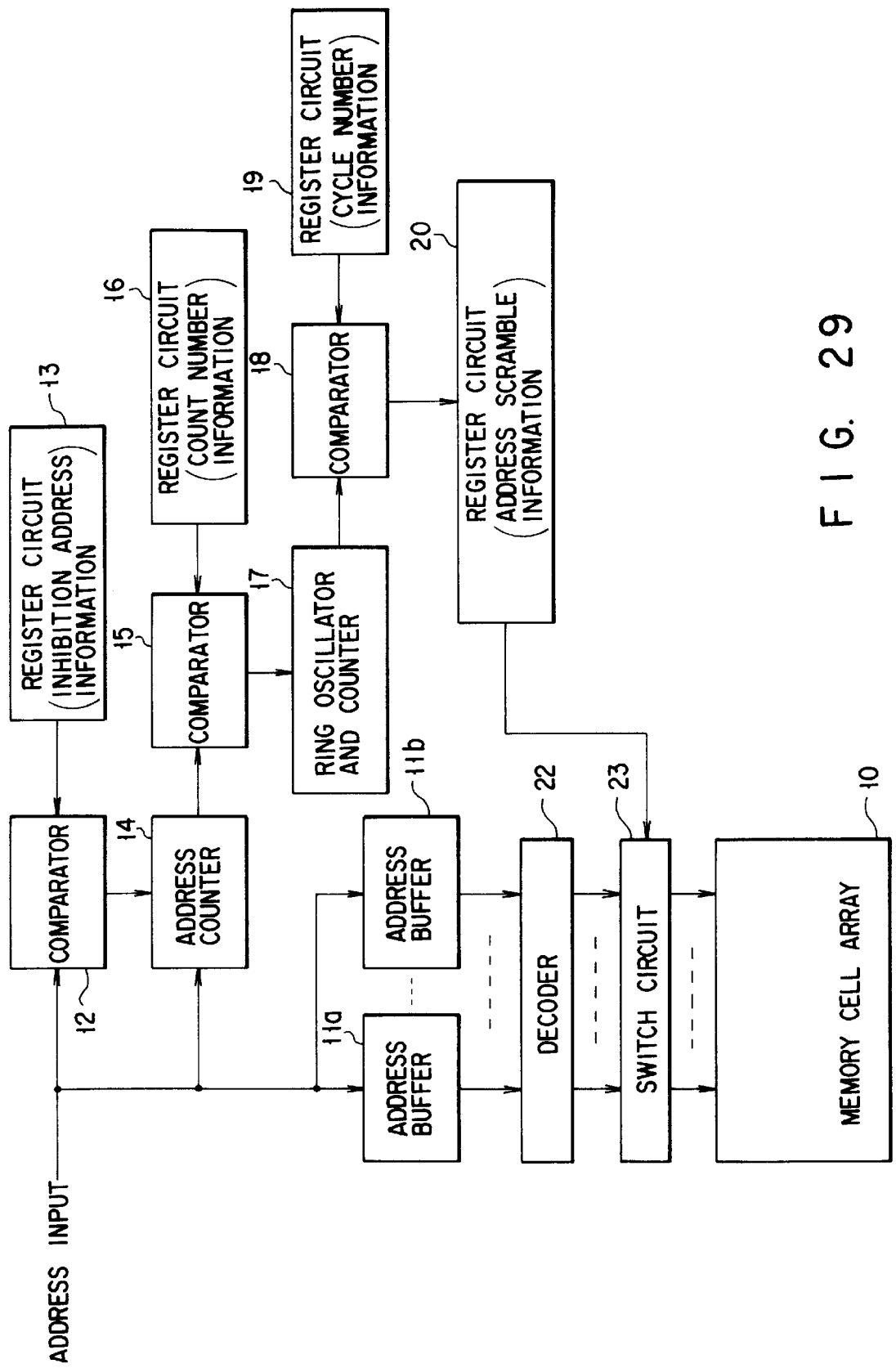

For example, in the first and second embodiments, the switch circuit 21 is provided between the address buffers 11a, 11b and the decoder 22 to scramble the address, but as shown in FIGS. 29 and 30, it is possible to provide a switch circuit 23 between the decoder 22 and the memory cell array 10 so as to scramble a decode signal output from the decoder 22; as shown in FIGS. 31 and 32, it is also possible to respectively provide switch circuits 21 and 23 between the address buffers 11a, 11b and the decoder 22 and between the decoder 22 and the memory cell array 10. At this time, the number of address bits to be scrambled is not limited to two and can be set to three or more.

Figure 34:
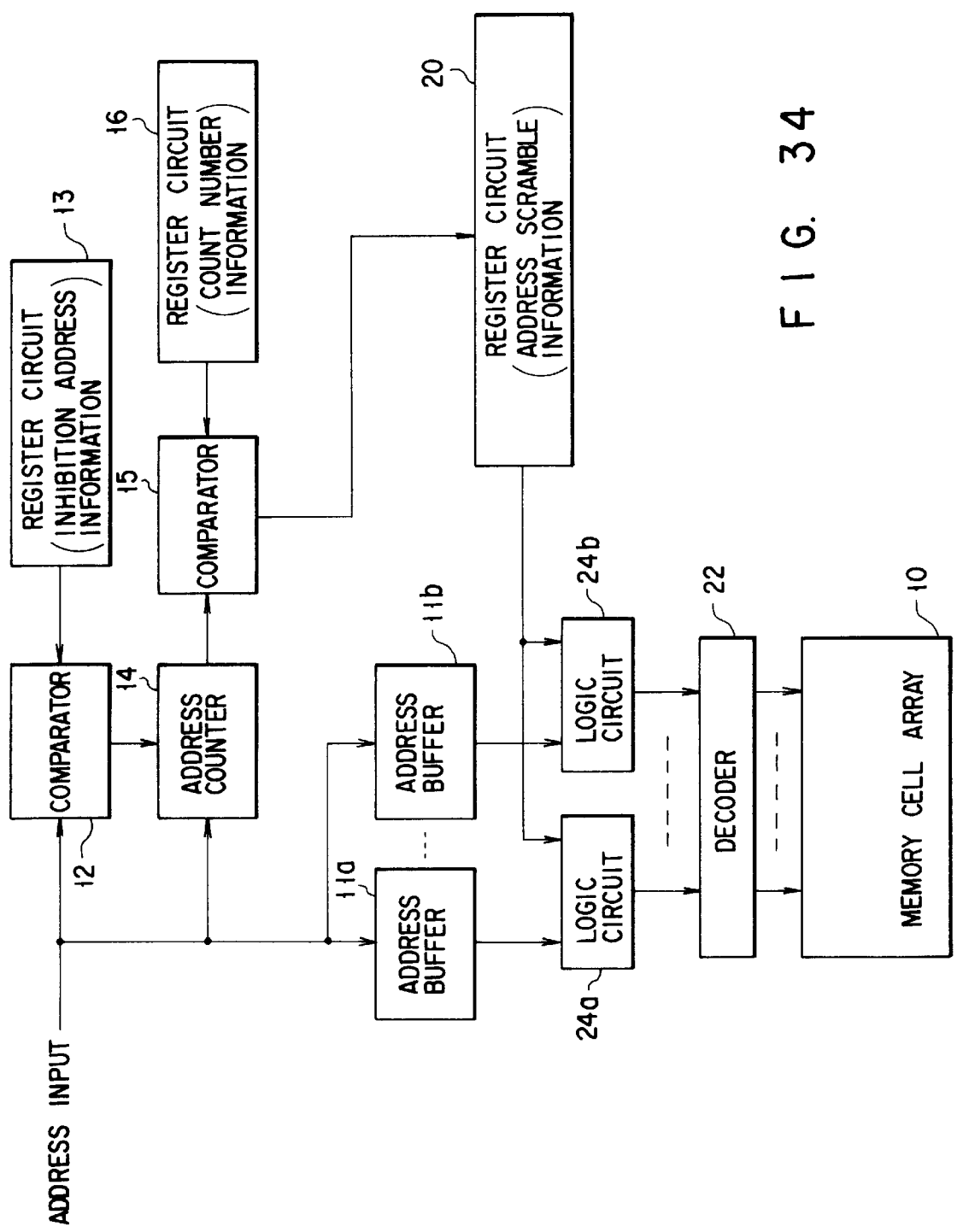
Figure 35:
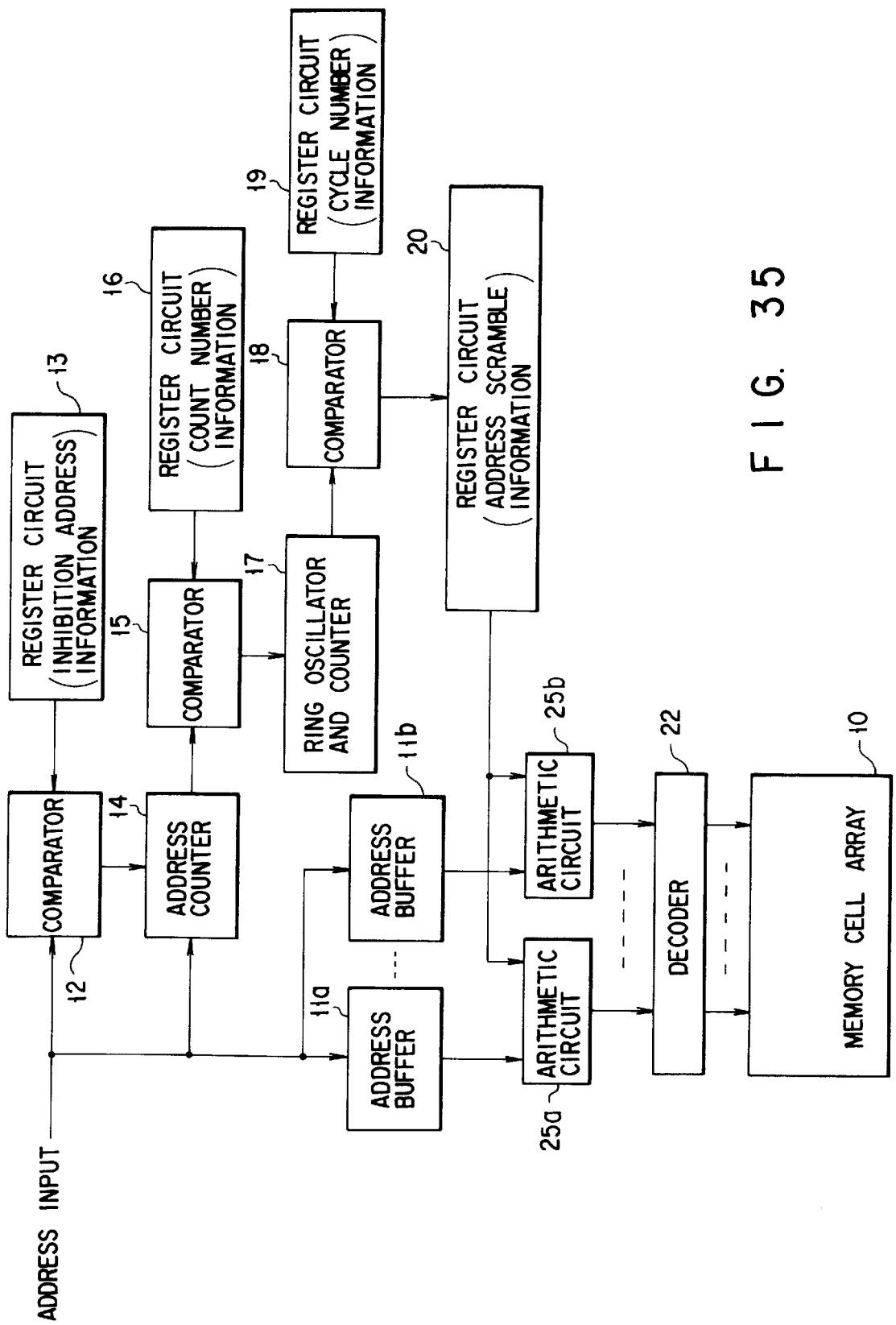
Figure 36:
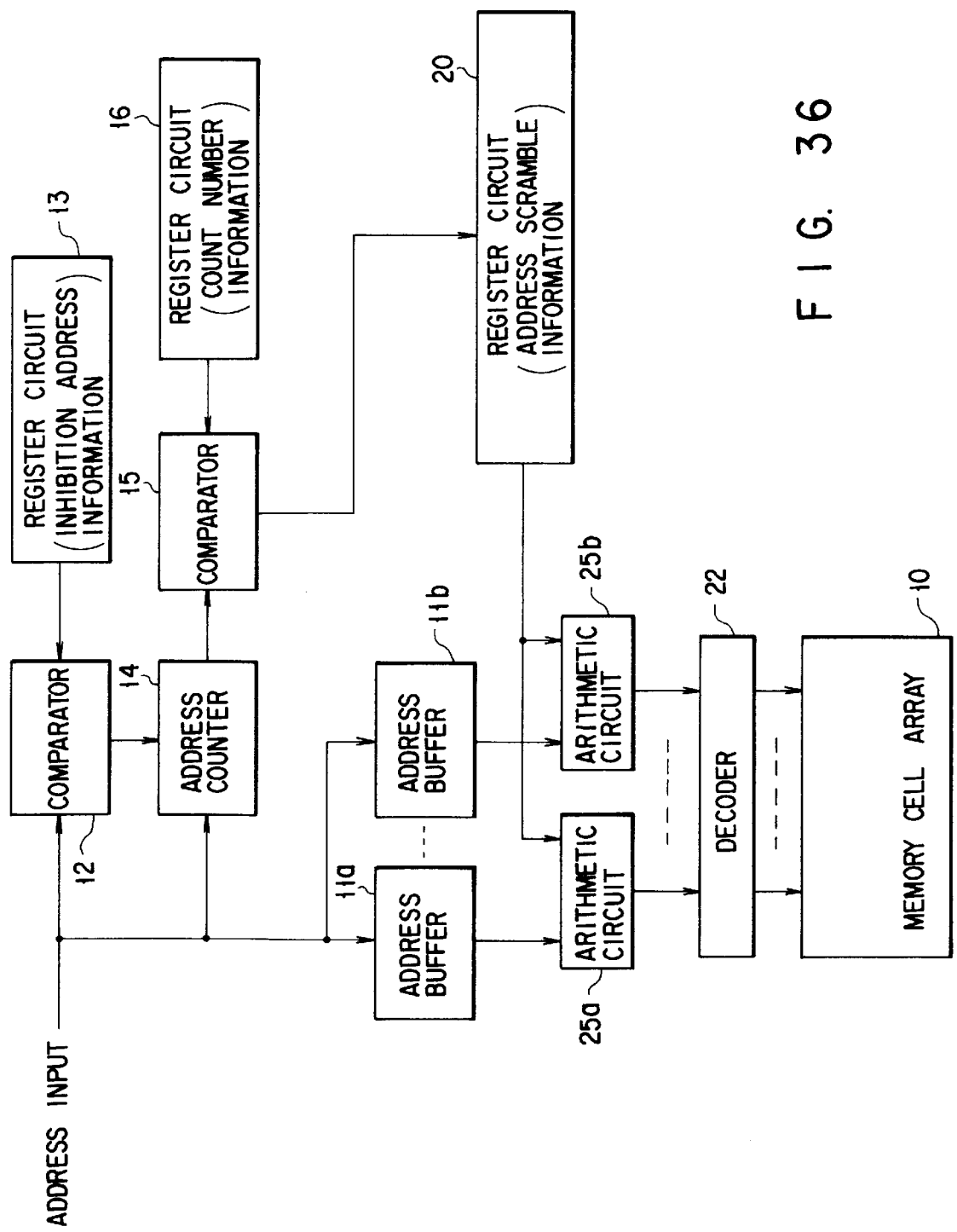

Further, as the switches S1, S2, S3, S4 constructing the switch circuit 21, switching elements such as MOS transistors or the transfer gates shown in FIG. 26 may be used, or as shown in FIGS. 33 and 34, it is possible to provide logic circuits 24a, 24b so as to subject the output of the register circuit 20 and the outputs of the address buffers 11a, 11b to the logical processes. As the logic circuits 24a, 24b, for example, AND gates, OR gates, exclusive-OR gates or the like can be used. Further, as shown in FIGS. 35 and 36, it is also possible to provide arithmetic circuits 25a, 25b to subject the output of the register circuit 20 and the outputs of the address buffers 11a, 11b to the arithmetic operations so as to scramble the address.

Figure 38:
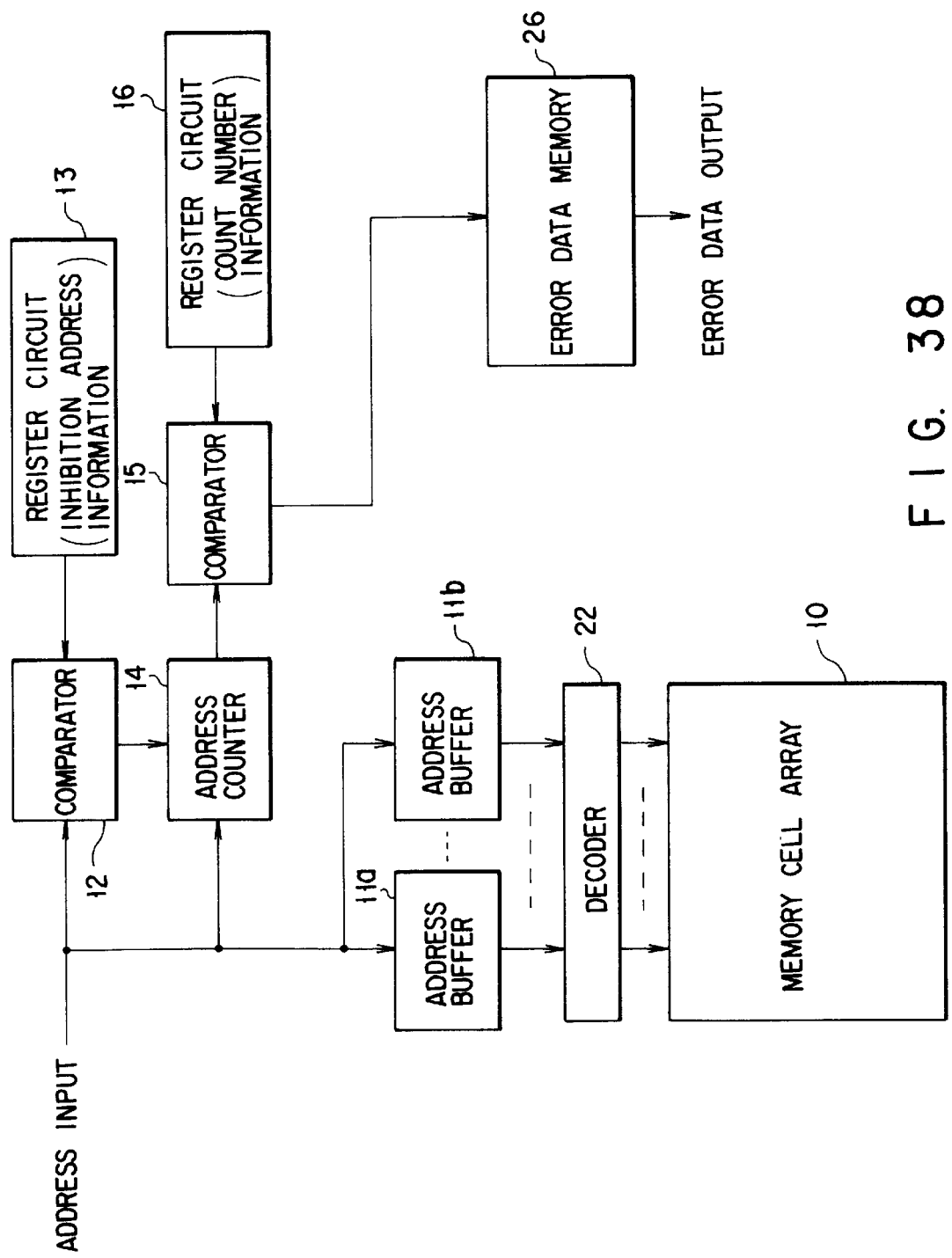

In the first to tenth embodiments, the address is scrambled to output error data, but as shown in FIGS. 37 and 38, it is possible to use an error data memory 26 storing error data different from data stored in the memory cell array 10 and access the error data memory 26 to output error data when coincidence is detected by the comparator 18 in the circuit of FIGS. 1, 29, 31, 33, 35 or by the comparator 15 in the circuit shown in FIGS. 28, 30, 32, 34, 36.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A non-volatile semiconductor memory device comprising:

a first comparing circuit for comparing an input address with an access inhibition address and outputting a first coincidence signal when the input address coincides with the access inhibition address;

a first counter responsive to the first coincidence signal for counting a number of input address changes;

a second comparing circuit for comparing a count of said first counter with a first count and outputting a second coincidence signal when the count of said first counter coincides with the first count;

an oscillator responsive to the second coincidence signal for outputting pulse signals in response to the second coincidence signal;

a second counter for counting the number of pulse signals output by said oscillator;

a third comparing circuit for comparing a count of said second counter and a second count and outputting a third coincidence signal when the count of said second counter coincides with the second count; and an output circuit responsive to the third coincidence signal for outputting data different from data stored in said non-volatile semiconductor memory device at an address which is input to said non-volatile semiconductor memory device.

2. A non-volatile semiconductor memory device according to claim 1, further comprising a decoder for selecting memory cells of a memory cell array of said non-volatile semiconductor memory, wherein data different from data stored in a memory cell which corresponds to the input address is output by changing, in response to the third coincidence signal, at least one of a decoder output supplied to said memory cell array and an address supplied to said decoder.

3. A non-volatile semiconductor memory device according to claim 1, wherein said output circuit includes an error data storing circuit for storing error data different from data stored in a memory cell array of said non-volatile semiconductor memory device and an access circuit responsive to the third coincidence signal for accessing said error data storing circuit, and data different from data stored in a memory cell of said memory cell array which corresponds to the input address is output.

4. A non-volatile semiconductor memory device according to claim 1, wherein said oscillator is operated in a cycle different from a readout cycle.

5. A non-volatile semiconductor memory device comprising:

a first storing circuit for storing at least one address to which access is inhibited;

a first comparing circuit for comparing an input address with the access inhibition address stored in said first storing circuit;

a first counter for counting a number of input address changes after detection by said first comparing circuit of a coincidence between the input address and the access inhibition address stored in said first storing circuit;

a second storing circuit for storing at least one first count;

a second comparing circuit for comparing a count of said first counter with the at least one first count stored in said second storing circuit;

an oscillator for outputting pulse signals when said second comparing circuit detects that the count of said first counter coincides with one of the at least one first count stored in said second storing circuit;

a second counter circuit for counting the pulse signals output by said oscillator;

a third storing circuit for storing at least one second count;

a third comparing circuit for comparing a count of said second counter with one of the at least one second count stored in said third storing circuit; and an output circuit for outputting data different from data stored in a memory cell of a memory cell array of said non-volatile semiconductor memory device at an address which is input to said non-volatile semiconductor memory device when said third comparing circuit detects that the count of said second counter coincides with one of the at least one second count stored in said third storing circuit.

6. A non-volatile semiconductor memory device according to claim 5, further comprising a decoder for selecting memory cells of said memory cell array, wherein data different from data stored in a memory cell which corresponds to the input address is output by changing, when said third comparing circuit detects that the count of said second counter coincides with one of the at least one second count stored in said third storing circuit, at least one of a decoder output supplied to said memory cell array and an address supplied to said decoder.

7. A non-volatile semiconductor memory device according to claim 5, wherein said output circuit includes an error data storing circuit in which error data different from data stored in a memory cell array is stored and an access circuit for accessing said error data storing circuit when the coincidence is detected by said third comparing circuit, and data different from data stored in a memory cell of said memory cell array corresponding to the input address is output.

8. A non-volatile semiconductor memory device according to claim 5, wherein data is written into said first, second and third storing circuits by use of a ROM mask.

9. A non-volatile semiconductor memory device according to claim 5, wherein said oscillator is operated in a cycle different from a readout cycle.

10. A non-volatile semiconductor memory device comprising:

a first comparing circuit for comparing an input address with an access inhibition address, said first comparing circuit outputting a first coincidence signal when the input address coincides with the access inhibition address;

a first counter circuit for counting a number of input address changes in response to the first coincidence signal output from said first comparing circuit;

a second comparing circuit for comparing a count of said first counter circuit with a stored count, said second comparing circuit outputting a second coincidence signal when the count of said first counter circuit coincides with the stored count; and an output circuit for outputting data different from stored data corresponding to an input address in response to the second coincidence signal output from said second comparing circuit, wherein correct data corresponding to input addresses are output during a time period from the time when the first coincidence signal is output from said first comparing circuit to the time when data different from stored data corresponding to the input address is output from said output circuit.

11. A non-volatile semiconductor memory device according to claim 10, further comprising a decoder for selecting memory cells of a memory cell array of said non-volatile semiconductor memory device, wherein data different from data stored in a memory cell which corresponds to the input address is output by changing, in response to the second coincidence signal, at least one of a decoder output supplied to said memory cell array and an address supplied to said decoder.

12. A non-volatile semiconductor memory device according to claim 10, wherein said output circuit includes an error data storing circuit in which error data different from data stored in a memory cell array is stored and an access circuit for accessing said error data storing circuit in response to said second coincidence signal output from said second comparing circuit, and data different from data stored in a memory cell of said memory cell array corresponding to the input address is output.

13. A non-volatile semiconductor memory device comprising:

a first storing circuit for storing at least one address to which access is inhibited;

a first comparing circuit for comparing an input address with the access inhibition address stored in said first storing circuit, said first comparing circuit outputting a first coincidence signal when the input address coincides with the access inhibition address stored in said first storing circuit;

a first counter circuit for counting a number of input address changes in response to the first coincidence signal output from said first comparing circuit;

a second storing circuit in which at least one count is stored;

a second comparing circuit for comparing a count of said first counter circuit with the at least one count number stored in said second storing circuit, said second comparing circuit outputting a second coincidence signal when the count of said first counter circuit coincides with the at least one count stored in said second storing circuit; and an output circuit for outputting data different from data stored in a memory cell of a memory cell array which corresponds to an input address in response to the second coincidence signal output from said second comparing circuit, wherein correct data corresponding to input addresses are output during a time period from the time when the first coincidence signal is output from said first comparing circuit to the time when data different from stored data corresponding to the input address is output from said output circuit.

14. A non-volatile semiconductor memory device according to claim 13, further comprising a decoder for selecting memory cells of said memory cell array, wherein data different from data stored in a memory cell which corresponds to the input address is output by changing, in response to the second coincidence signal, at least one of a decoder output supplied to said memory cell array and an address supplied to said decoder.

15. A non-volatile semiconductor memory device according to claim 13, wherein said output circuit includes an error data storing circuit in which error data different from data stored in a memory cell array is stored and an access circuit for accessing said error data storing circuit in response to the second coincidence signal output from said second comparing circuit, and data different from data stored in a memory cell of said memory cell array corresponding to the input address is output.

16. A non-volatile semiconductor memory device according to claim 13, wherein data is written into said first and second storing circuits by use of a ROM mask.

17. A non-volatile semiconductor memory device according to claim 2, wherein said output circuit further comprises a scrambling circuit for changing the address supplied to said decoder in response to the third coincidence signal.

18. A non-volatile semiconductor memory device according to claim 2, wherein said output circuit further comprises a scrambling circuit for changing the decoder output supplied to said memory cell array in response to the third coincidence signal.

19. A non-volatile semiconductor memory device according to claim 2, wherein said output circuit further comprises a first scrambling circuit for changing the address supplied to said decoder in response to the third coincidence signal and a second scrambling circuit for changing the decoder output supplied to said memory cell array in response to the third coincidence signal.

20. A non-volatile semiconductor memory device according to claim 6, wherein said output circuit further comprises a scrambling circuit for changing the address supplied to said decoder when said third comparing circuit detects that the count of said second counter coincides with one of the at least one second count stored in said third storing circuit.

21. A non-volatile semiconductor memory device according to claim 6, wherein said output circuit further comprises a scrambling circuit for scrambling the decoder output supplied to said memory cell array when said third comparing circuit detects that the count of said second counter coincides with one of the at least one second count stored in said third storing circuit.

22. A non-volatile semiconductor memory device according to claim 6, wherein said output circuit further comprises a first scrambling circuit for changing the address supplied to said decoder when said third comparing circuit detects that the count of said second counter coincides with one of the at least one second count stored in said third storing circuit and a second scrambling circuit for changing the decoder output supplied to said memory cell array when said third comparing circuit detects that the count of said second counter coincides with one of the at least one second count stored in said third storing circuit.

23. A non-volatile semiconductor memory device according to claim 11, wherein said output circuit further comprises a scrambling circuit for changing the address supplied to said decoder in response to the second coincidence signal.

24. A non-volatile semiconductor memory device according to claim 11, wherein said output circuit further comprises a scrambling circuit for changing the decoder output supplied to said memory cell array in response to the second coincidence signal.

25. A non-volatile semiconductor memory device according to claim 11, wherein said output circuit further comprises a first scrambling circuit for changing the address supplied to said decoder in response to the second coincidence signal and a second scrambling circuit for scrambling the decoder output supplied to said memory cell array in response to the second coincidence signal.

26. A non-volatile semiconductor memory device according to claim 14, wherein said output circuit further comprises a scrambling circuit for changing the address supplied to said decoder in response to the second coincidence signal.

27. A non-volatile semiconductor memory device according to claim 14, wherein said output circuit further comprises a scrambling circuit for changing the decoder output supplied to said memory cell array in response to the second coincidence signal.

28. A non-volatile semiconductor memory device according to claim 14, wherein said output circuit further comprises a first scrambling circuit for changing the address supplied to said decoder in response to the second coincidence signal and a second scrambling circuit for changing the decoder output supplied to said memory cell array in response to the second coincidence signal.

29. A memory device, comprising:

memory cells;

a selecting circuit for selecting said memory cells; and scrambling circuitry for scrambling one or both of an address supplied to said selecting circuit and an output of said selecting circuit based on a coincidence of an input address to said memory device and a preselected address, wherein said scrambling circuitry comprises a first memory portion for storing the preselected address and a first comparing circuit for comparing the preselected address and the input address and outputting a first coincidence signal when the preselected address coincides with the input address, wherein said scrambling circuitry further comprises:

an address counter responsive to the first coincidence signal for counting a number of input address changes;

a second memory portion for storing a first count; and a second comparing circuit for comparing the first count stored in said second memory portion and a count of said address counter and outputting a second coincidence signal when the first count coincides with the count of said address counter.

30. A memory device according to claim 29, wherein said scrambling circuitry comprises a switch circuit for switching the address supplied to said selecting circuit.

31. A memory device according to claim 29, wherein said scrambling circuitry comprises a switch circuit for switching the output of said selecting circuit.

32. A memory device according to claim 29, wherein said scrambling circuitry comprises a first switch circuit for switching the address supplied to said selecting circuit and a second switch circuit for switching the output of said selecting circuit.

33. A memory device according to claim 29, wherein said scrambling circuitry comprises logic circuitry for changing the address supplied to said selecting circuit.

34. A memory device according to claim 29, wherein said scrambling circuit comprises arithmetic circuitry.

35. A memory device according to claim 29, wherein said scrambling circuitry further comprises:

an oscillator responsive to the second coincidence signal for outputting pulses;

a pulse counter for counting the pulses output by said oscillator;

a third memory portion for storing a second count;

a third comparing circuit for comparing the second count stored in said third memory portion and a count of said pulse counter and outputting a third coincidence signal when the second count coincides with the count of said pulse counter.

36. A memory device, comprising:

memory cells;

a selecting circuit for selecting said memory cells; and scrambling circuitry for scrambling an address supplied to said selecting circuit based on a coincidence of an input address to said memory device and a preselected address, wherein said scrambling circuitry comprises arithmetic circuitry.

37. A memory device, comprising:

memory cells;

detecting circuitry for detecting an input to said memory device: and circuitry configured to cause correct data to be output from said memory cells during a first time period following the detection of the input and to cause error data to be output from said memory cells during a second time period following the detection of the input, wherein the first time period is based on a number of oscillations of an oscillator following the detection of the input.

38. A memory device, comprising:

memory cells;

detecting circuitry for detecting an input to said memory device: and circuitry configured to cause correct data to be output from said memory cells during a first time period following the detection of the input and to cause error data to be output from said memory cells during a second time period following the detection of the input, wherein the first time period is based on a number of addresses input to said memory device following the detection of the input and on a number of oscillations of an oscillator following the input of the number of addresses to said memory device.

39. A memory device according to claim 37, further comprising:

additional memory cells for storing the error data.

40. A memory device according to claim 37, further comprising:

a selecting circuit for selecting said memory cells, wherein said circuitry comprises a scrambling circuit for scrambling at least one of an address supplied to said selecting circuit and a selecting signal output by said selecting circuit.

* * * * *